United States Patent
Natori

(10) Patent No.: US 6,704,224 B2
(45) Date of Patent: Mar. 9, 2004

(54) NON-VOLATILE SEMICONDUCTOR MEMORY APPARATUS

(75) Inventor: Kanji Natori, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 30 days.

(21) Appl. No.: 10/246,727

(22) Filed: Sep. 19, 2002

(65) Prior Publication Data

US 2003/0076717 A1 Apr. 24, 2003

(30) Foreign Application Priority Data

Sep. 19, 2001 (JP) ......................................... 2001-285080

(51) Int. Cl.⁷ .............................................. G11C 16/04
(52) U.S. Cl. .................................. 365/185.18; 365/229
(58) Field of Search .......................... 365/185.18, 229, 365/226

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 5,986,935 A * | 11/1999 | Iyama et al. | ............ 365/185.18 |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,584,032 B2 * | 6/2003 | Fujioka et al. | ............... 365/229 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

Hayashi, Yutaka et al., "Twin MONOS Cell with Dual Control Gates," *2000 Symposium on VLSI Technology Digest of Technical Papers*.

Chang, Kuo–Tung et al., "A New SONOS Memory Using Source Side Injection for Programming", *IEEE Electron Device Letters*, vol. 19, No. 7, Jul. 1998, pp. 253–255.

Chen, Wei–Ming et al., "A Novel Flash Memory Device with SPlit Gate Source Side Injection and ONO Charge Storage Stack (SPIN)", *1997 Symposium on VLSI Technology Digest of Technical Papers*, pp. 63–64.

* cited by examiner

*Primary Examiner*—Huan Hoang
(74) *Attorney, Agent, or Firm*—Oliff & Berridge, PLC

(57) ABSTRACT

The invention achieves a high speed access when shifting to an active mode from a standby mode, in particular immediately after shifting to a read, and reduces the current consumption at the time of standby. A strong charge pump generates 5.0V and a power supply voltage of 8.0V. The power supply voltage is supplied to constant voltage circuits. The constant voltage circuits generate voltages VPBL, VPYS, VPCGL, VPCGL, VPCGH and VPCGH, respectively, according to the respective read, program and erase operation modes. The constant voltage circuit that operates in active modes consumes a large amount of current when it supplies the voltage VPCGH. In contrast, the constant voltage circuit operates with a low current consumption and generates the voltage VPCGH in the standby mode. With the voltage VPCGH that is generated by the constant voltage circuit in the standby mode, a high speed access is possible when shifting from the standby mode to the active mode, and in particular, immediately after shifting to a read mode. Also, the current consumption in the standby mode can be substantially reduced.

10 Claims, 26 Drawing Sheets

F: Floating

NON-VOLATILE SEMICONDUCTOR MEMORY APPARATUS

BACKGROUND OF THE INVENTION

1. Field of Invention

The present invention relates to non-volatile semiconductor memory apparatuses, and more particularly to non-volatile semiconductor memory apparatuses equipped with charge pump devices that step up power supply voltage.

2. Description of Related Art

Semiconductor memory apparatuses may be classified into a variety of different types depending on their functions. Such semiconductor memory apparatuses include a memory cell array that is formed of memory cells arranged in a matrix. In general, an address in a row direction and a column direction in the memory cell array is designated in performing a reading, programming or erasing operation for each of the memory cells.

By controlling voltages applied to a signal line in the row direction and a signal line in the column direction that are connected to each of the memory cells, a specified memory cell can be accessed, such that a specified operation among reading, programming and erasing operations thereof can be performed. In other words, in order to select a specified memory cell, a voltage different from other voltages to be applied to other memory cells may be generated from the power supply voltage and applied.

Recently, MONOS (Metal-Oxide-Nitride-Oxide-Semiconductor or -substrate) type devices have been developed as non-volatile semiconductor devices that are electrically erasable and have non-volatility. A MONOS type non-volatile semiconductor memory apparatus has memory cells that each have two memory elements, as described in detail in a publication (Y. Hayashi, et al., 2000 Symposium on VLSI Technology Digest of Technical Papers p. 122–p. 123).

As described in this publication, to access each of the memory elements of the MONOS type non-volatile semiconductor memory apparatus via signal lines (control lines) that are provided according to the number of the memory cells, not only two kinds of voltage values, but a plurality of kinds of voltage values need to be set for each of the signal lines (control lines).

In this case, devices that each have a pair of a charge pump circuit that operates with the power supply voltage and a regulator may be prepared in the number of kinds of voltages required for each of the operations of the memory.

SUMMARY OF THE INVENTION

The response of the charge pump is slow due to restrictions of its clock frequencies and the like. Accordingly, when the operation of the charge pump circuit is stopped in a standby mode, it takes a long time, after shifting to an active mode, in particular when shifting to a read that requires a high voltage, to reach an accessible state.

In this respect, the charge pump may be operated even during a standby mode, and a high voltage is maintained by the charge pump, and a regulator may be used to generate required operation voltages.

However, the amount of current that circulates in the charge pump and a regulator that generates operation voltages to read in particular is extremely large. Therefore, it is a problem that the current consumption in the standby mode is high.

The present invention addresses the problems described above, and provides a non-volatile semiconductor memory apparatus that can substantially reduce the current consumption in a standby mode by using a regulator for standby with a low current consumption.

A non-volatile semiconductor memory apparatus in accordance with the present invention includes: a charge pump device that steps up and outputs a power supply voltage; an operation voltage setting device that sets operation voltages to execute plural modes for a specified non-volatile memory element within a memory array formed of the plurality of non-volatile memory elements; a constant voltage device for activation that is provided with voltages output from the charge pump device to generate the operation voltages in an active state; and a constant voltage device for standby that is provided with a voltage output from the charge pump device to generate a voltage based on the operation voltage with a lower current consumption than voltages generated by the constant voltage device for activation.

With this structure, the charge pump device steps up the power supply voltage and supplies the same to the constant voltage devices for activation and standby. The constant voltage device for activation, at the time of activation, generates operation voltages from the output of the charge pump device and supplies the same to the operation voltage setting device. The operation voltage setting device uses voltages generated by the constant voltage device for activation to set operation voltages to execute various modes, such as, for example, a read mode, program mode and erase mode. In contrast, at the time of standby, the constant voltage device for standby generates operation voltages from the output of the charge pump device. The constant voltage device for standby causes a low current consumption, such that the current consumption amount at the time of standby can be markedly reduced. Also, voltages based on the operation voltages are generated even at the time of standby, such that a high speed access becomes possible even in a shift from a standby mode to an active mode.

The operation voltage generated by the constant voltage device for standby is a voltage higher than the power supply voltage.

With this structure, even when the power supply voltage is stepped up to generate operation voltages, the current consumption at the time of standby can be reduced, and a high speed access when shifting to an active mode can be achieved.

The constant voltage device for standby generates an operation voltage for a read mode for the non-volatile memory element.

With this structure, at the time of reading, high operation voltages and high speed response are required. Since the constant voltage device for standby generates voltages based on the operation voltages to provide reading, a high speed access is made possible even when shifting to an active mode.

The charge pump device steps up the power supply voltage to generate a plurality of voltages.

With this structure, the range of voltage values that can be generated by one or a plurality of constant voltage devices can be broadened.

The constant voltage device is capable of generating constant voltages of different voltage values depending on read, program or erase mode for the non-volatile memory element.

With this structure, the constant voltage device can obtain constant voltages according to an operation mode, i.e., a read mode, a program mode or an erase mode. Therefore, when a plurality of operation voltages are required for each of the modes, each mode can be executed.

The non-volatile memory element is a memory element that forms a twin memory cell controlled by one word gate and first and second control gates.

With this structure, for example, a reading operation, a programming operation or an erasing operation can be performed for the memory array with twin memory cells.

The operation voltage setting device is characterized in that it sets voltage values provided from the constant voltage device independently for the first and second control gates, and an impurity layer to access trapped charge of the non-volatile memory element.

With this structure, the operation voltage setting device sets operation voltages required for a word gate that selects a twin memory cell, sets operation voltages required for the first and second control gates to select a non-volatile memory element within the selected twin memory cell, and sets required operation voltages for an impurity layer to access trapped charge of the selected non-volatile memory element. As a result, for example, a reading operation, a programming operation or an erasing operation can be performed for a specified non-volatile memory element in a specified twin memory cell.

The operation voltage setting device includes: a word line connected to a word gate of the twin memory cell in the same row; a control gate line that is commonly connected to the mutually adjacent first and second control gates in the same column of the twin memory cells arranged adjacent to each other in a row direction; and a bit line that is commonly connected to impurity layers to access trapped charge arranged in the same column of the mutually adjacent non-volatile memory elements of the twin memory cells arranged adjacent to each other in the row direction. Voltages provided from the constant voltage device are set independently for the control gate line and the bit line.

With this structure, the operation voltage setting device selects with the word line twin memory cells in the same row, commonly selects with the control gate line mutually adjacent first and second control gates in the same column of the twin memory cells arranged adjacent to each other in the row direction, and commonly selects with the bit line impurity layers in the same column to access trapped charge of the mutually adjacent non-volatile memory elements of the twin memory cells arranged adjacent to each other in the row direction. As a result, even when a memory array is formed of numerous non-volatile memory elements, sections at which operation voltages are to be set can be reduced.

Also, a non-volatile semiconductor memory apparatus in accordance with the present invention includes: a charge pump device that steps up and outputs a power supply voltage; an operation voltage setting device that sets an operation voltage to execute each of reading, programming and erasing operations for a specified non-volatile memory element within a memory array composed of a plurality of twin memory cells each having two non-volatile memory elements controlled by one word gate, and first and second control gates; a constant voltage device for activation that is provided with voltages output from the charge pump device to generate the operation voltages in an active mode; and a constant voltage device for standby that is provided with a voltage output from the charge pump device to generate in an active mode a voltage based on the operation voltage to be supplied to the first and second control gates in a read mode with a lower current consumption than voltages generated by the constant voltage device for activation.

With this structure, the operation voltage setting device sets operation voltages required for the first and second control gates to thereby select a non-volatile memory element within a twin memory cell. More particularly, at the time of reading, the change cycle of operation voltages supplied to the first and second control gates is short compared to the other operation modes. However, at the time of standby, the charge pump device generates operation voltages to be supplied to the first and second control gates with a lower current consumption than those generated by the constant voltage device for activation, and therefore a high speed access is possible even immediately after shifting to a read.

The non-volatile memory element has an ONO film formed of an oxide film (O), a nitride film (N) and an oxide film (O) as a charge trap site.

With this structure, operation voltages of an apparatus using a MONOS type non-volatile memory can be set.

DETAILED DESCRIPTION OF PREFERRED EMBODIMENTS

Figure 1:
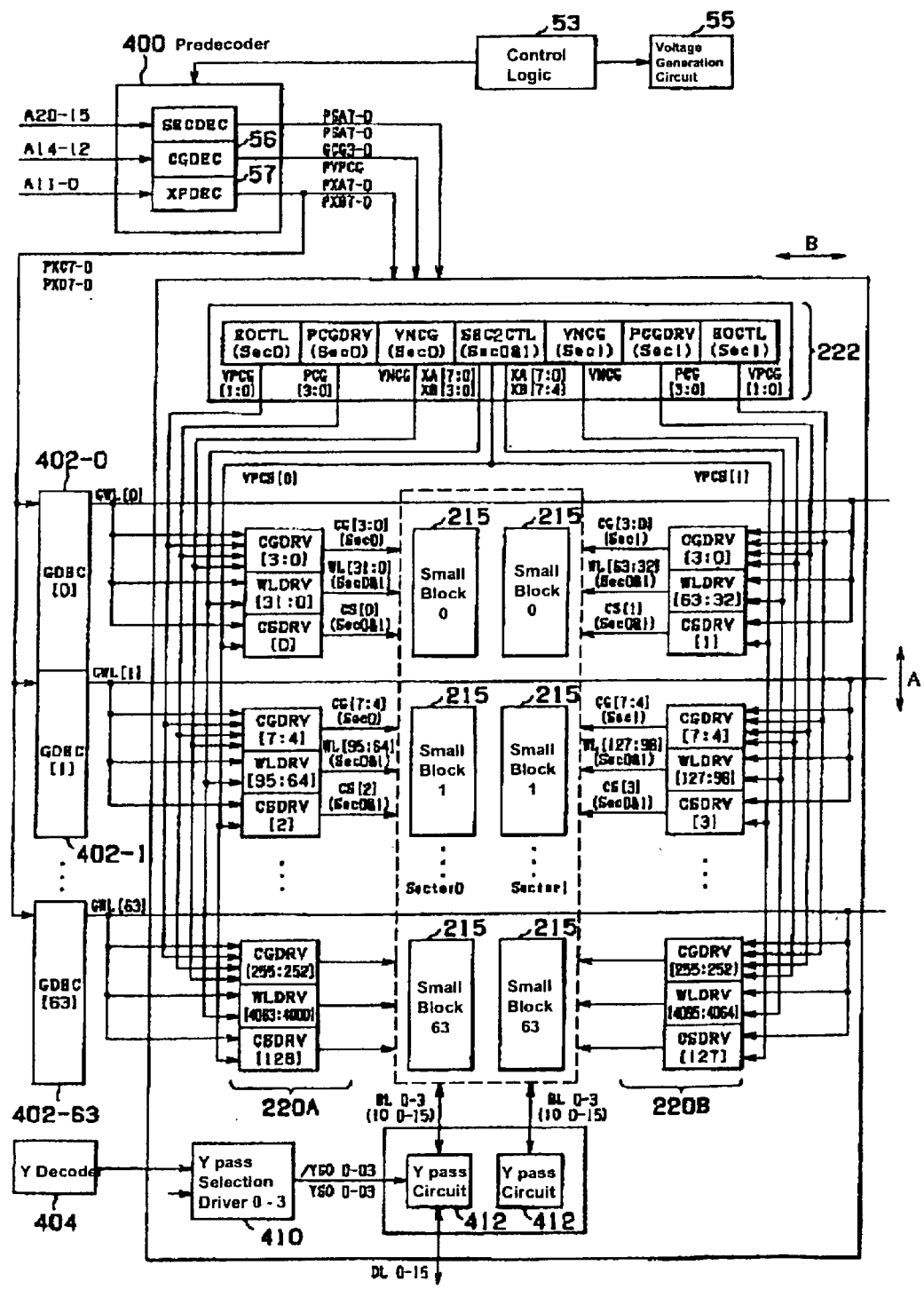
FIG. 1 is a schematic of a non-volatile semiconductor memory apparatus in accordance with a first embodiment of the present invention.

Embodiments of the present invention are described below in detail with reference to the accompanying drawings. FIG. 1 is a schematic of a non-volatile semiconductor memory apparatus in accordance with a first embodiment of the present invention.

The present embodiment enables a voltage generation circuit having one charge pump to supply multiple kinds of voltages to an array block that is formed with twin memory cells.

Also, in accordance with the present embodiment, in the read mode, a margin of the charge pump output against a required operation voltage is made to be greater than in other operation modes, such that the output of the charge pump is always maintained at a voltage greater than the required operation voltage.

Also, the present embodiment uses regulators (constant voltage circuit) with low current consumption, and changes the regulators to be used in a standby mode and in an active mode so that the current consumption in the standby mode can be reduced.

Figure 2:
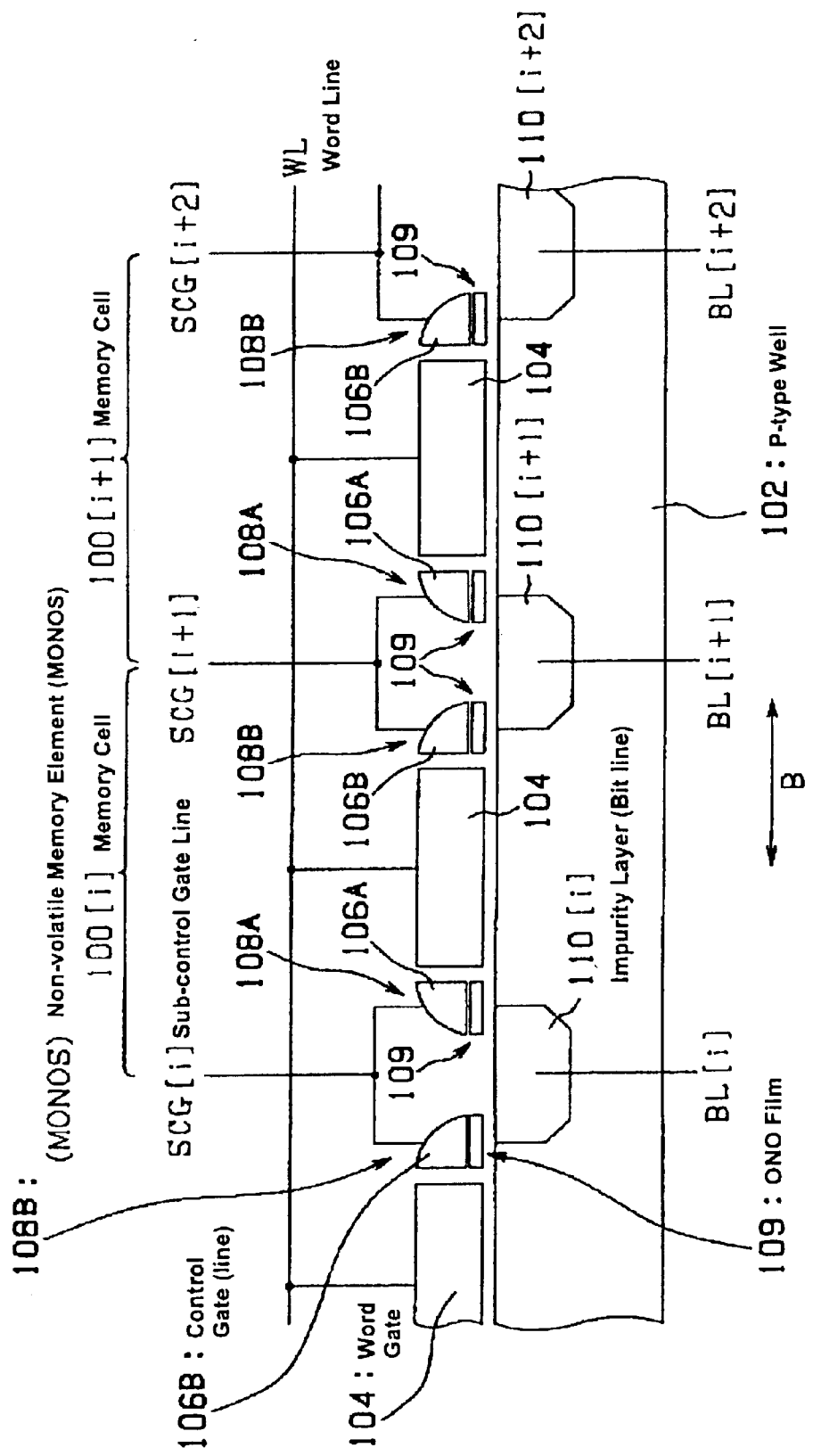
FIG. 2 is a schematic that shows a cross-section of a structure of twin memory cells.

First, referring to FIG. 2, a structure and operation of twin memory cells forming an array block are described. FIG. 2 schematically shows a cross-section of a structure of twin memory cells.

As shown in FIG. 2, a plurality of twin memory cells 100 ( . . . , 100 [i], 100 [i+1], . . . ) are arranged on a P-type well 102 in B direction (hereafter "row direction" or "word line direction"). As described below, the twin memory cells 100 are also arranged in plurality in a column direction (a direction that is perpendicular to the paper surface of FIG. 2) (hereafter "bit line direction"), so as to be arranged in a matrix.

Each of the twin memory cells 100 is formed from a word gate 104 that is formed over the P-type well 102 through a gate dielectric layer, first and second control gates 106A and 106B, and first and second memory elements (MONOS memory elements) 108A and 108B.

Each of the first and second memory elements 108A and 108B includes an ONO film 109 that is formed of an oxide film (O), a nitride film (N) and an oxide film (O) stacked in layers, and is capable of trapping charge in the ONO film 109. First and second control gates 106A and 106B are formed on the ONO films 109 of the first and second memory elements, respectively. Operating conditions of the first and second memory elements 108A and 108B are controlled by the first and second control gates 106A and 106B which are formed from polysilicon that corresponds to M (metal) of MONOS. It is noted that the first and second control gates 106A and 106B may be formed from conductive material such as suicide.

A word gate 104, which is formed of material including, for example, polysilicon, is formed electrically insulated from and between the first and second memory elements 108A and 108B. Voltages applied to the word gate 104 determine whether or not the first and second memory elements 108A and 108B of each of the twin memory cells 100 are selected.

In this manner, each of the twin memory cells 100 includes first and second MONOS memory elements 108A and 108B equipped with split gates (first and second control gates 106A and 106B), and one word gate 104 is shared by the first and second MONS memory elements 108A and 108B.

The first and second MONOS memory elements 108A and 108B independently function as charge trap sites. The word gates 104, which control trapping of charge, are arranged in the row direction at intervals as shown in FIG. 2, and commonly connected to one word line WL which is formed from polycide or the like. By supplying a specified signal to the word line WL, at least one of the first and second memory elements in each of the twin memory cells 100 in the same row can be selected.

Each of the control gates 106A and 106B extends along the column direction, and is shared by a plurality of twin memory cells 100 that are arranged in the same column, and functions as a control gate line. The mutually adjacent control gates 106A and 106B of the memory cells 100 that are arranged adjacent to one another in the row direction are commonly connected to a sub-control gate line SCG ( . . . , SCG [i], SCG [i+1], . . . ). The sub-control gate line SCG may be formed of a metal layer that is formed in a layer above the control gates 106A and 106B and the word line WL.

By applying a voltage to each of the sub-control gate lines SCG independently from one another, the two memory elements 108A and 108B in each of the memory cells 100 can be controlled independently of each other.

An impurity layer 110 ( . . . , 110 [i], 110 [i+1], . . . ) is formed in the P-type well 102 between the mutually adjacent memory elements 108A and 108B of the memory cells 100 that are arranged adjacent to one another in the row direction. The impurity layers 110 are, for example, n-type impurity layers formed in the P-type well 102, extend in the column direction, are shared by a plurality of twin memory cells 100 that are arranged in the same column, and function as bit lines BL ( . . . , BL [i], BL [i+1], . . . ).

By application of voltages and current detection with respect to the bit lines BL, reading and programming of charge (data) can be performed for one of the memory elements in each of the memory cells 100 which is selected by the word line WL and the sub-control gate line SCG.

(Overall Structure Of Non-volatile semiconductor memory apparatus)

An overall structure of a non-volatile semiconductor memory apparatus that is structured using the above-described twin memory cells 100 is described with reference to FIGS. 3(A) through 3(E). FIGS. 3(A)–3(E) are schematics of more concrete compositions of the array block shown in FIG. 1.

Figure 3:
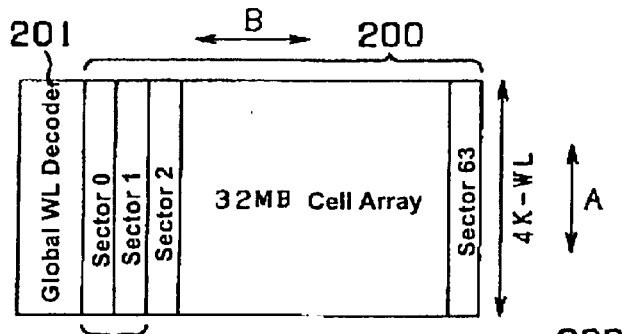
FIGS. 3(A)–(E) are schematics that show a non-volatile semiconductor memory apparatus.
Figure 3:
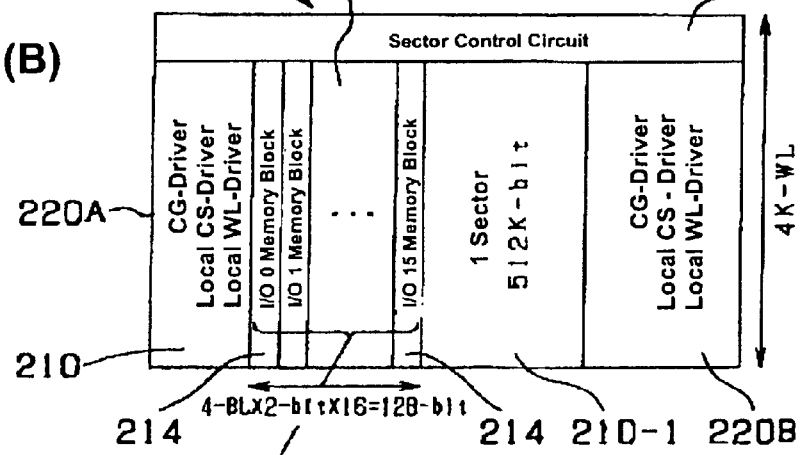
Figure 3:
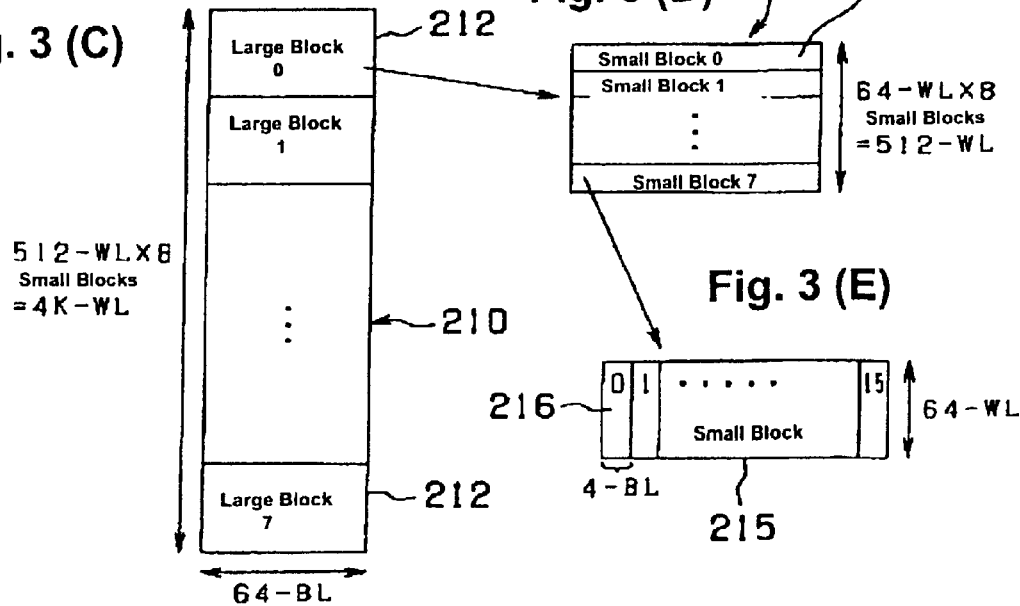
Figure 3:
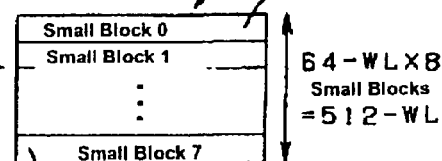
Figure 3:
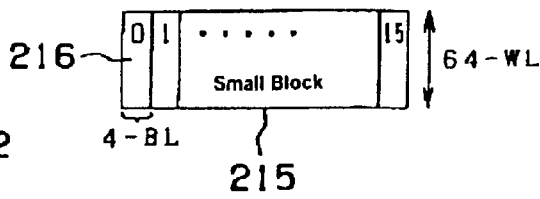

FIG. 3(A) is a schematic of a non-volatile semiconductor memory apparatus in one chip, and includes a memory cell array region 200 and a global word line decoder 201. The memory cell array region 200 includes, for example, a total of 64 sector regions, i.e., $0^{th}$–$63^{rd}$ sector regions (210-0 through 210-63).

The sixty four sector regions 210 are provided by dividing the memory cell array region 200 in the second direction (row direction) B as indicated in FIG. 3(A), and each of the sector regions 210 has a longitudinally oblong configuration with the first direction (column direction) A being its longer side direction. The minimum unit to erase data is the sector region 210, and data stored in the sector region 210 may be erased all together or in a time sharing manner.

The memory cell array regions 200 includes, for example, 4K word lines WL, and 4K bit lines BL. In the present embodiment, one bit line SBL is connected to two MONOS memory elements 108A and 108B, and therefore 4K sub-bit lines SBL means a storage capacity of 8 Kbit. Each of the sector regions 210 has a storage capacity equivalent to ⅟₆₄ of the entire storage capacity, which is a storage capacity defined by (4K word lines WL)×(64 bit lines BL)×2.

FIG. 3(B) shows details of two adjacent ones of the sector regions 210, e.g., the $0^{th}$ and $1^{st}$ sector regions, in the non-volatile semiconductor memory apparatus shown in FIG. 3(A). As shown in FIG. 3(B), local driver regions (including local control gate driver, local bit line selection driver and local word line driver) 220A and 220B are disposed on both sides of the two sectors 210. Also, a sector control circuit 222 is disposed, for example, along upper sides of the two sectors 210 and the two local driver regions 220A and 220B.

Each of the sector regions 210 is divided in the second direction so that it has 16 memory blocks 214 for I/O 0 through I/O 15 (i.e., memory blocks corresponding to the respective I/O bits) that allow 16-bit data to be read or written. Each of the memory blocks 214 includes 4K (4096) word lines WL, as indicated in FIG. 3(B).

As indicated in FIG. 3(C), each of the sector regions 210 shown in FIG. 3(B) is divided into 8 large blocks 212 in the first direction A. Each of the large blocks 212 is divided into 8 small blocks 215 in the first direction A, as indicated in FIG. 3(D).

Each of the small blocks 215 includes 64 word lines WL, as indicated in FIG. 3(E). Also, each of the small blocks 215 is formed of 16 small memory blocks 216 arranged along the row direction.

Figure 4:
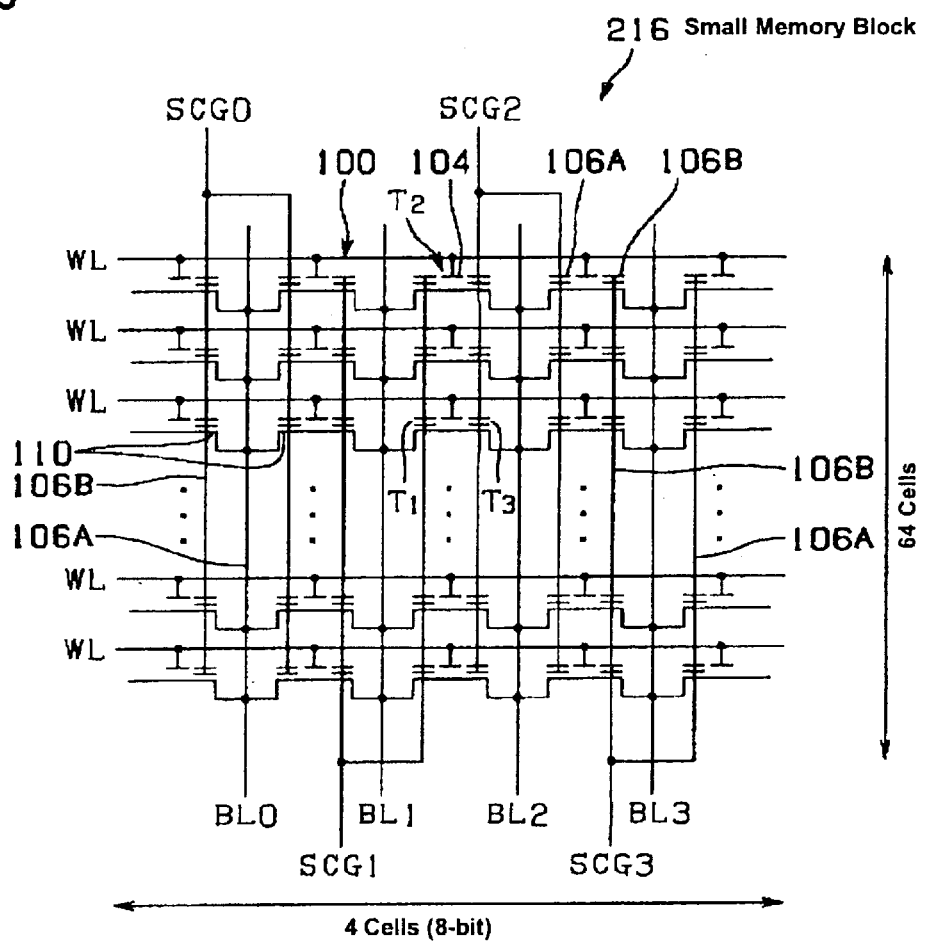
FIG. 4 is a schematic that shows a circuit diagram of a small block.

FIG. 4 shows a circuit diagram of a concrete structure of the small memory block 216 shown in FIGS. 3(A)–3(E).

In FIG. 4, the twin memory cell 100 has a transistor T2 that is driven by the word gate 104 and transistors T1 and T3 that are respectively driven by the first and second control gates 106A and 106B, which are serially connected to one another. The small memory block 216 is formed by arranging, for example, 64 twin memory cells 100 in the column direction and, for example, 4 twin memory cells 100 in the row direction, and includes 64 word lines WL, 4 sub-control gate lines SCG0–SCG3, and 4 bit lines BL0–BL3.

All the word gates 104 in each of the rows are commonly connected to the word line WL in each of the rows. The mutually adjacent first and second control gates 106A and 106B of the twin memory cells 100 that are arranged adjacent to one another in the row direction are connected to common sub-control gate lines SCG0–SCG3, which are shared by the twin memory cells 100 in the same column. Also, the mutually adjacent impurity layers 110 of the twin memory cells 100 that are arranged adjacent to one another in the row direction are connected to common bit lines BL0–BL3, which are shared by the twin memory cells 100 in the same column.

The small memory block 216 is the minimum control unit to read and program operations. Four of the word gates 104 in one of the rows are selected by the 64 word lines WL, one of the rows selected by setting the 4 sub-control gate lines SCG0–SCG4 with specified voltages, and one of the 8 memory elements 108A and 108B in the row direction in the selected row is selected as a selected memory element. In other words, one (1 bit) of the 8 memory elements in the row direction can be selected as a selected memory element, which can be read or programmed by the bit line BL.

Figure 5:
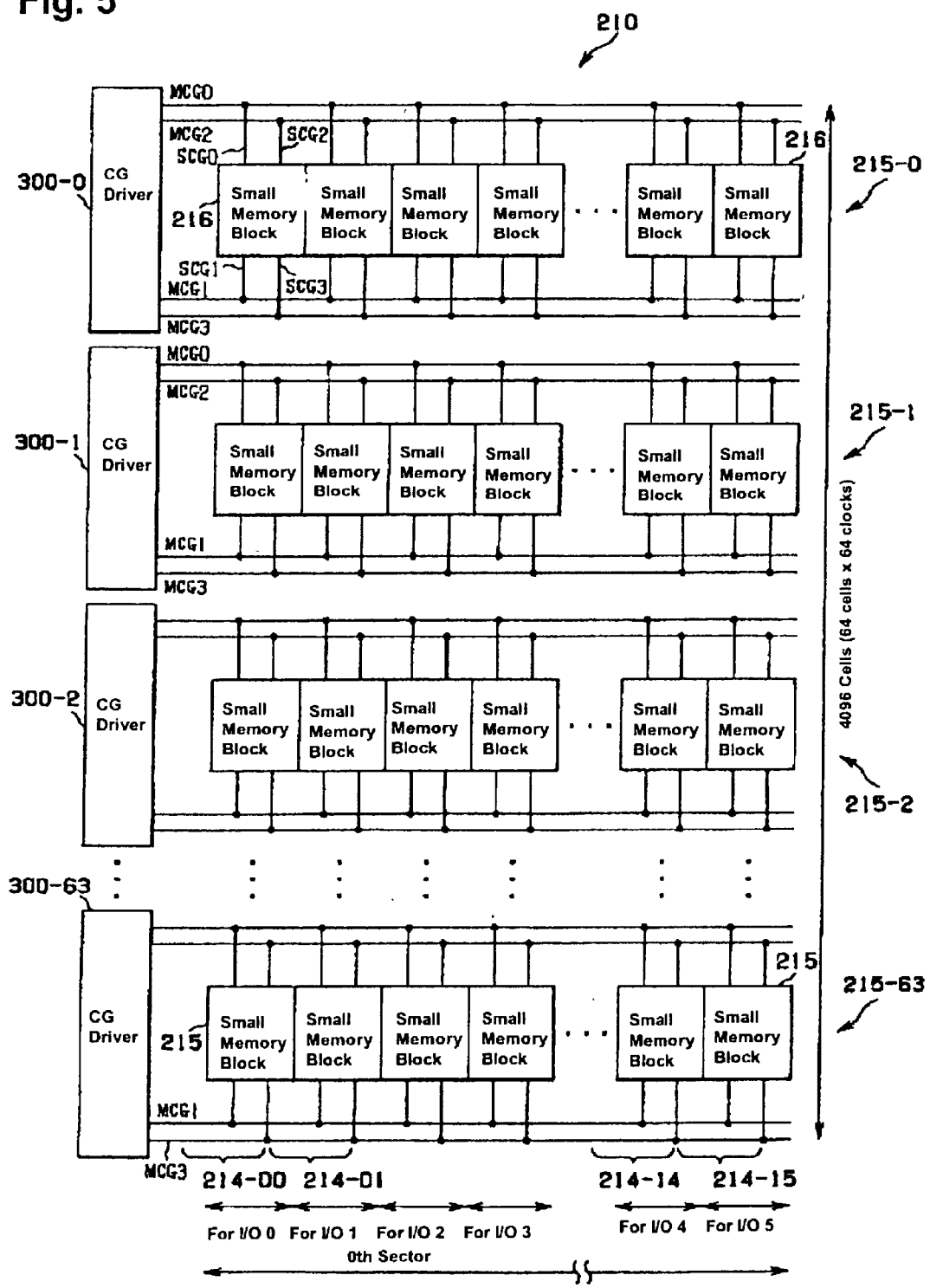
FIG. 5 is a schematic for describing numerous small blocks and their wirings of one sector.

FIG. 5 is a schematic of a concrete structure of the sector 210.

As described above, the sector 210 is formed of 16 memory blocks 214 arranged in the row direction, in other words, 64 small memory blocks 216 arranged in the column direction. All of the sub-control gate lines SCG0–SCG3 of the 16 small memory blocks 216 arranged in the row direction are respectively commonly connected to one another to compose main control gate lines MCG0–MCG3, respectively.

The main control gate lines MCG0–MCG3 of the small blocks 215 (215-0 through 215-63) are connected to a CG driver 300 (300-0 through 300-63). The CG driver 300 is a control gate driver section for each unit of the sector 210, and controls the main control gate lines MCG0–MCG3, to thereby set voltage levels of the sub-control gate lines SCG0–SCG3 of the small blocks 215 (memory blocks 216).

One of the 64 small blocks 215 is selected as a selected block, and a reading and programming operation is performed for a selected memory element within the selected block in bits. When there is a selected block in one of two adjacent sectors, a small block 215 in the other adjacent sector is called an opposing block.

Figure 6:
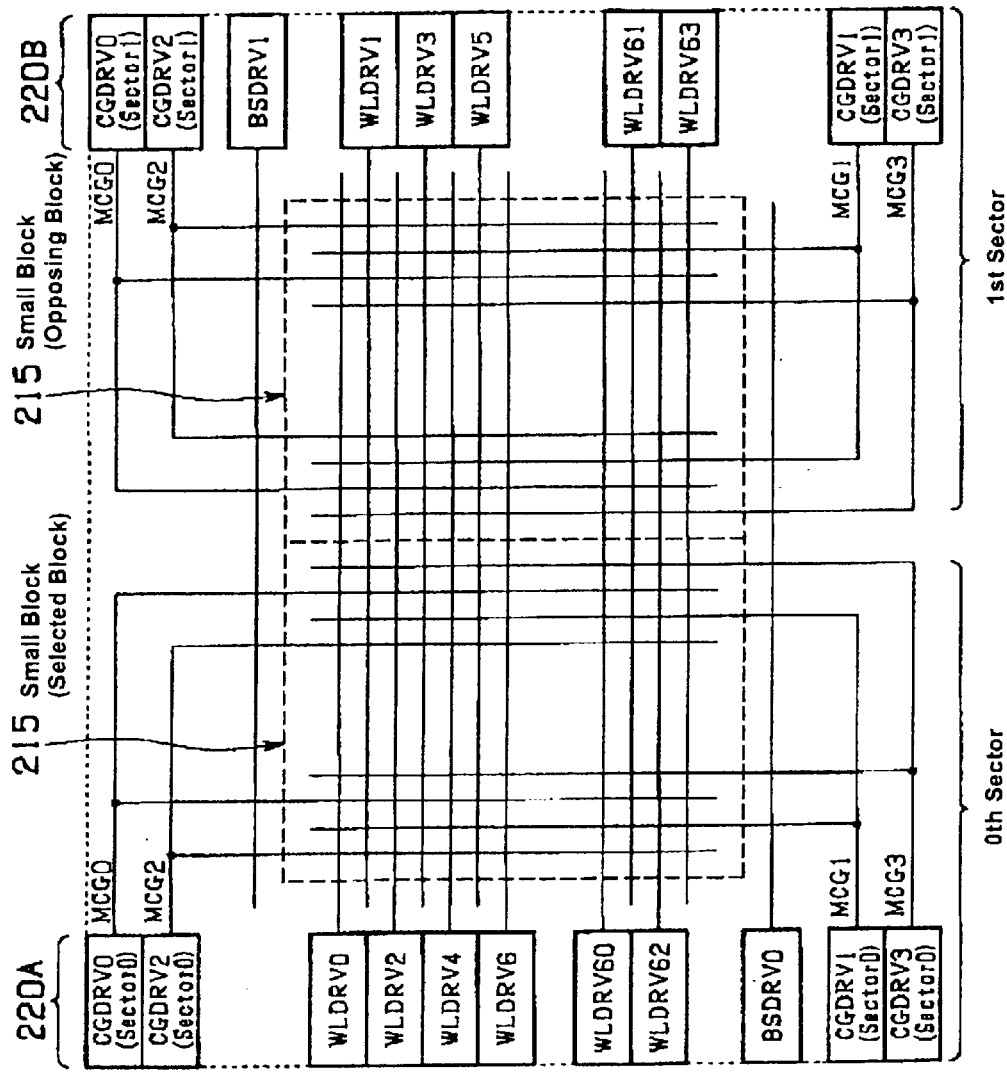
FIG. 6 is a schematic indicating the relation between small blocks and local drivers in two adjacent sectors.

FIG. 6 is a schematic of a structure of each driver that controls one of the small blocks 215 in the $0^{th}$ sector and an opposing small block 215 in the $1^{st}$ sector. FIG. 6 shows details of the two small blocks 215 within the adjacent two sectors, the $0^{th}$ and $1^{st}$ sectors 210, and local driver regions 220A and 220B disposed on both sides of the small blocks 215. It is noted that the $2^{nd}$ sector, $3^{rd}$ sector, $4^{th}$ sector, $5^{th}$ sector, ... have the same structure as the one shown in FIG. 6.

As indicated in FIG. 6, in the local driver region 220A on the left side of the FIG., $0^{th}$ through $3^{rd}$ local control gate line drivers (CGDRV0–CDGRV3) are disposed. The four local control gate line drivers CGDRV0–CDGRV3 in FIG. 6 form one CG driver 300 shown in FIG. 5. The local control gate line drivers CGDRV0–CDGRV3 control each of the sub-control gate lines SCG0–SCG3 in each of the small memory blocks 216 within the small block 215.

Also, the local driver region 220A within the $0^{th}$ sector is provided with $0^{th}$, $2^{nd}$, ..., and $62^{nd}$ local word line drivers (WLDRV0, WLDRV2, ..., and WLDRV62) that drive even numbered word lines WL0, WL2, ..., and WL62 in the $0^{th}$ and $1^{st}$ sectors, respectively. Similarly, the local driver region 220B within the 1st sector is provided with 1st, 3rd, . . . , and 63rd local word line drivers (WLDRV1, WLDRV3, . . . , and WLDRV63) that drive odd numbered word lines WL1, WL3, . . . , and WL63 in the 0th and 1st sectors, respectively. The local driver regions 220A and 220B are also provided with a redundant word line driver (WLDRVR) (not shown) that drives one redundant word line within the 0th sector.

The local word line drivers (WLDRV0 through WLDRV63) are controlled by the global WL decoder 201 shown in FIGS. 3(A)–3(E) and are capable of selecting the word gates 104 in each of the rows of the 0th and 1st sectors in units of rows. Also, with the local control gate line drivers (CGDRV0 through CGDRV3), one of the memory elements of the twin memory cell in a specified column can be selected in units of memory elements for each sector.

Also, the local driver regions 220A and 220B are provided with 0th and 1st local bit line drivers (BSDRV0 and BSDRV1) disposed therein, respectively. The 1st first local bit line driver (BSDRV1) drives bit line selection transistors 217A (see FIG. 7) that control whether or not odd numbered bit lines BL1 and BL3 in the 0th and 1st sectors are to be connected to the main bit lines in units of small blocks 215. The 0th local bit line driver (BSDRV0) drives bit line selection transistors 217B (see FIG. 7) that control whether or not even numbered bit lines BL0 and BL2 in the 0th and 1st sectors are to be connected to the main bit lines in units of small blocks 215.

Figure 7:
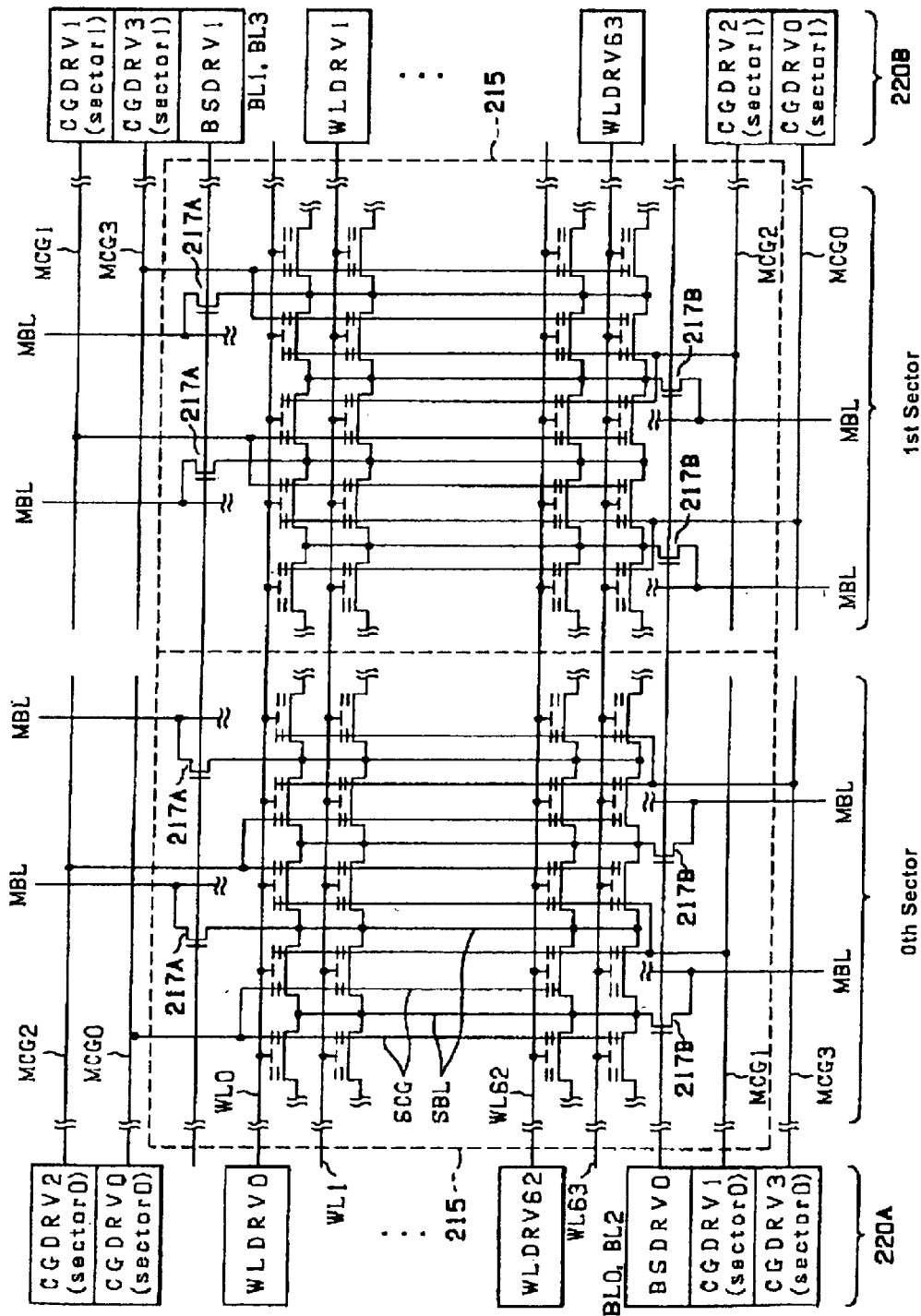
FIG. 7 is a schematic that shows a circuit diagram indicating the relation between small blocks and control gate drivers.

FIG. 7 shows a circuit diagram of a concrete structure of the small blocks 215 arranged adjacent to one another in the 0th and 1st sectors. Other pairs of adjacent sectors have the same structure.

The bit lines BL (BL0–BL3) are disposed in each of the small memory blocks 216 independently from one another, as indicated in FIG. 4. The bit lines BL0 (impurity layers) in the respective small memory blocks within an I/O memory block, and also the bit lines BL1, BL2 and BL3, are mutually, commonly connected by metal wirings to form a main bit line MBL. A bit line selection transistor 217A is disposed in each path that leads from each of the main bit liens MBL to each of the bit lines BL1 and BL3 in the small memory blocks 216, and a bit line selection transistor 217B is disposed in each path that leads to each of the bit lines BL0 and BL2 in the small memory blocks 216.

Paths for signal input and output of each of the I/O memory blocks are four main bit lines MBL, and the four bit line selection transistors 217A and 217B are turned on by the local bit line drivers (BSDRV0 and BSDRV1) to make each of the bit lines BL active, and voltage application and current supply to each of the bit lines BL are controlled to enable reading and programming operations in units of 1 bit.

As indicated in FIG. 6 and FIG. 7, the word lines WL are shared by the 0th sector and the 1st sector, but the main bit lines MBL and main control gate lines MCG are provided independently from one another.

(Driver Circuits in 0th and 1st Sectors)

Next, referring to FIG. 1, circuits that drive the twin memory cells within each of the small blocks 215 in the 0th and 1st sectors are described.

First, as components that are shared by the 0th through 63rd sectors, there are provided a control logic 53, a voltage generation circuit 55, a pre-decoder 400, 64 global decoders 402-0 through 402-63, and a Y decoder 404. The control logic 53 is provided with a variety of control inputs, and generates a variety of control signals including control signals for the voltage generation circuit 55.

The pre-decoder 400 decodes address signals A[20-0] that specify non-volatile memory elements subject to selection (selected cells). Table 1 below shows meanings of the address signals A[20-0].

TABLE 1

| Address | Group | Function |
| --- | --- | --- |
| A[20–15] | Sector | Choose 1 of 64 |
| A[14–12] | Row | Choose 1 of 8 |
| A[11–0] |  | Choose 1 of 4096 |
| A[11–9] | Large Block | Choose 1 of 8 |
| A[8–6] | Small Block | Choose 1 of 8 |
| A[5–0] | Column | Choose 1 of 64 |

As indicated in Table 1 above, one sector among the 64 sectors is selected with the upper address signal A[20-15], one bit among 4 cells (8 bits) in one small memory block 216 shown in FIG. 4 is selected with the intermediate address signal A[14-12], and one word line WL among the 4096 word lines is selected with the lower address signal A[11-0]. Also, one of the 8 large blocks 212 existing in one sector is selected with the address signal A[11-9], one of the 8 small blocks 215 existing in one large block 212 is selected with the address signal A[8-6], and one of the 64 word lines WL existing in one small block 215 is selected with the address signal A[5-0].

The 64 global decoders 402-0 through 402-63 activate the 64 global word lines GWL[0] through GWL[63] based on the results of pre-decoding the lower address signal A[11-0] by the pre-decoder 400. At the time of data reading and data programming, only one of the global word lines GWL is made active (at Vdd). At the time of data erasing, when data in one sector are erased all together, all of the 64 global word lines GWL are made active (at Vdd), to thereby select all of the word lines within one sector, and a word line voltage for data erasing is supplied. Also, all of the control gate lines within one sector are selected, and a control gate voltage for data erasing is supplied.

The Y decoder 404 drives Y pass circuits 412 via a Y pass selection driver 410, and connect bit lines selected within the small blocks 215 to sense amplifiers or bit line drivers in the succeeding stage.

As described above, the local driver regions 220A and 220B are provided on right and left sides of each of the small blocks 215 shown in FIG. 7.

For example, in the case of the small block 215-0 in the first row within the 0th and 1st sectors, there are provided in the local driver region 220A on the left side of the small block 215-0 the control gate line drivers CGDRV that drive the four main control gate lines MCG of the small block 215-0 in the first row within the 0th sector, in other words, the local CG drivers CGDRV 0-3, the local word line drivers WLDRV [31-0] that drive the even numbered 32 word lines WL within the 0th and 1st sectors, and a local control gate line selection driver CSDRV [0] that drives the bit line selection transistors 217B that are connected to the odd numbered sub-control gate lines SCG 1, 3, . . . , and 63 in the 0th and 1st sectors. In the local driver region 220B on the right side, there are provided the control gate line drivers CGDRV that drive the four main control gate lines MCG of the small block 215-0 in the first row within the 1st sector, in other words, the local CG drivers CGDRV 0-3, the local word line drivers WLDRV [63-32] that drive the odd numbered 32 word lines WL within the 0th and 1st sectors, and a local control gate line selection driver CSDRV [1] that drives the bit line selection transistors 217A that are con nected to the even numbered sub-control gate lines SCG 0, 2, . . . , and 62 in the $0^{th}$ and $1^{st}$ sectors.

In the present embodiment, the cell array block uses twin memory cells. Therefore, as described below, to perform data reading operation, data programming operation and data erasing operation by driving the cell array, plural kinds of voltages need to be supplied in each of the operations in addition to the erasing operation. The voltage generation circuit 55 is controlled by the control logic 53 and generates plural kinds of voltages that are to be used for the memory cell array block.

Next, descriptions are provided as to data reading operation, data programming operation and data erasing operation for the memory cell array region 200 using voltages provided from the voltage generation circuit 55.

Figure 8:
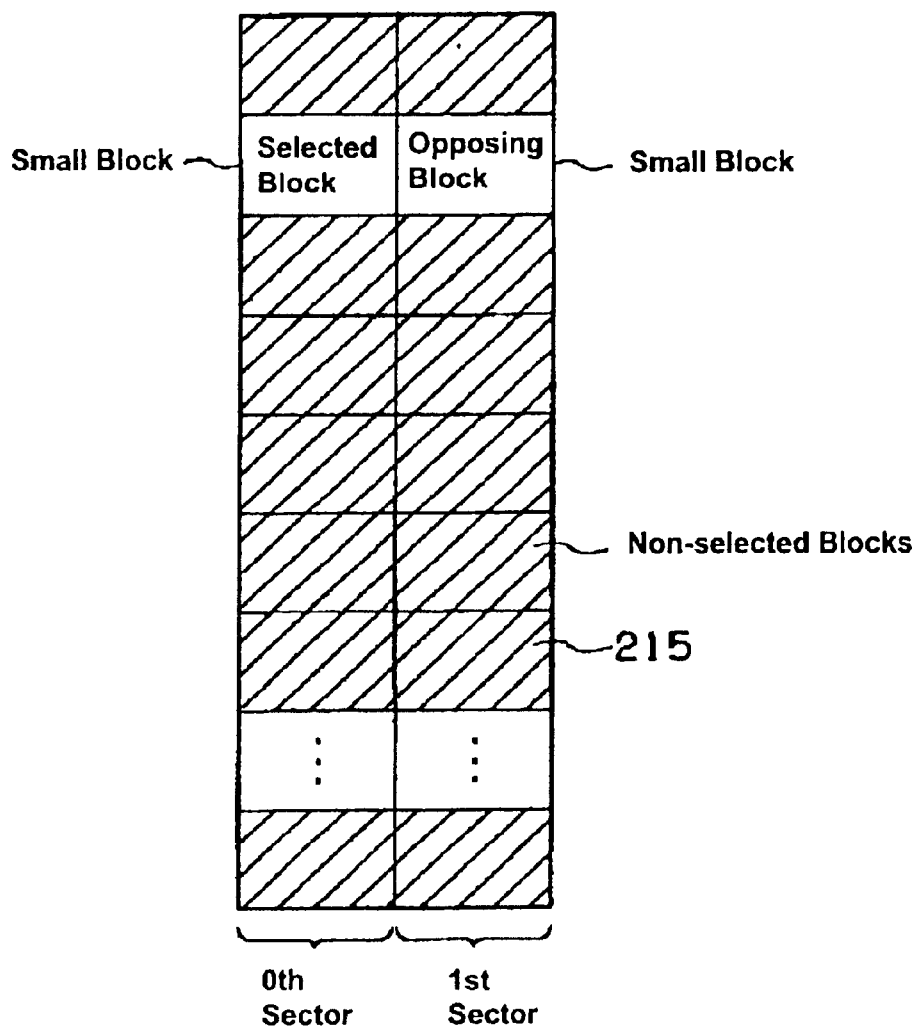
FIG. 8 is a schematic indicating a selected block, a non-selected opposing block opposing the selected block, and other non-selected blocks.

For data reading and data programming operations, the control is performed in units of two adjacent ones of the sectors 210, e.g., an odd numbered sector and an even numbered sector. FIG. 8 describes the control for two sectors. Each rectangular frame in FIG. 8 indicates a small block row. A column of small block rows on the left side indicates one sector (the $0^{th}$ sector in the example shown in FIG. 8), and a column of small block rows on the right side indicates a sector ($1^{st}$ sector) adjacent to the $0^{th}$ sector.

A selected block is a selected small block row, and an opposing block is a non-selected small block row adjacent to the selected block. Small block rows with hatched lines in FIG. 8 indicate all non-selected blocks other than the selected block and the opposing block.

Table 2 and Table 3 below show potentials on the respective control gate lines CG, bit lines BL and word lines WL at the time of reading, programming and erasing operations.

Figure 9:
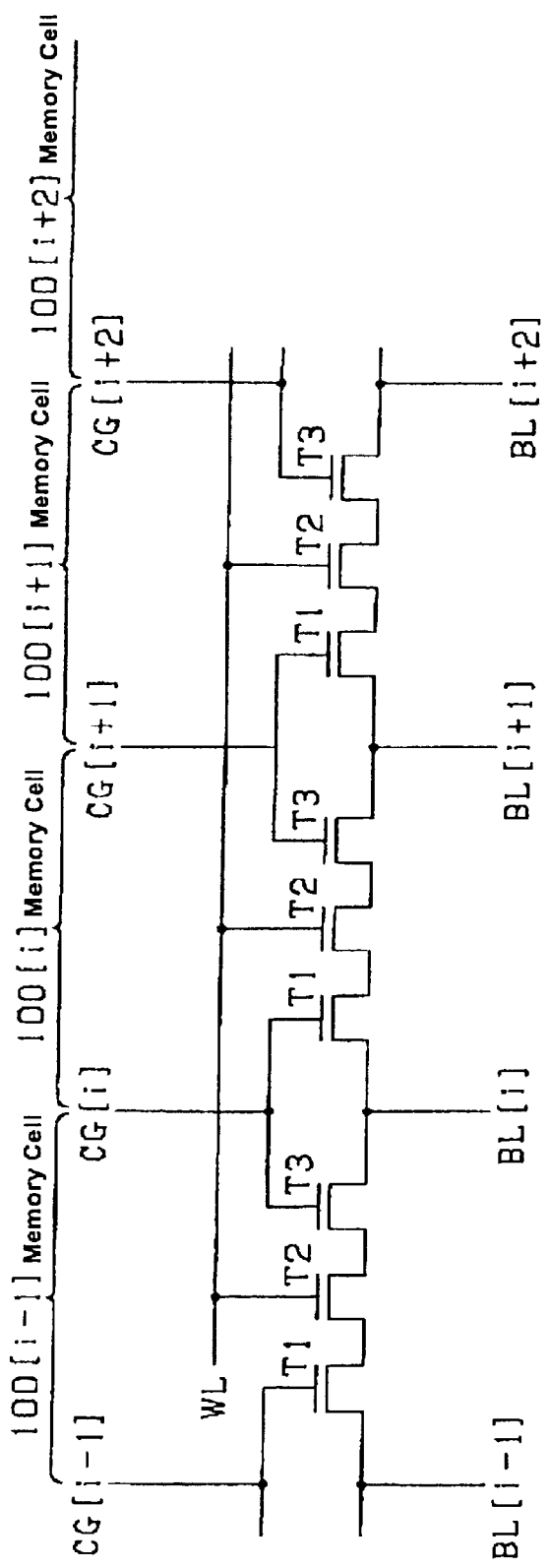
FIG. 9 is a schematic that shows an equivalent circuit of a memory cell.

Referring to Table 2 and Table 3, each of the operation modes is described below. The description of the operations shall be provided with one twin memory cell 100 being typified to have a transistor T2 driven by the word gate 104 and transistors T1 and T3 respectively driven by the first and second control gates 106A and 106B, which are serially connected to one another, as shown in FIG. 9.

TABLE 3

| | Opposing Block | | | | Non-selected Block | | | |
|---|---|---|---|---|---|---|---|---|
| Mode | BS | WL | BL | CG | BS | WL | BL | CG |
| Read | 4.5 V Opposing side Vdd Selected side | Vdd or 0 V | 0 V | 0 V | 0 V | 0 V | F | 0 V |
| Program | 8 V | About 1 V or 0 V | 0 V | 0 V | 0 V | 0 V | F | 0 V |
| Erase | 8 V | 0 V | 0 V | 0 V | 0 V | 0 V | F | 0 V |

Figure 10:
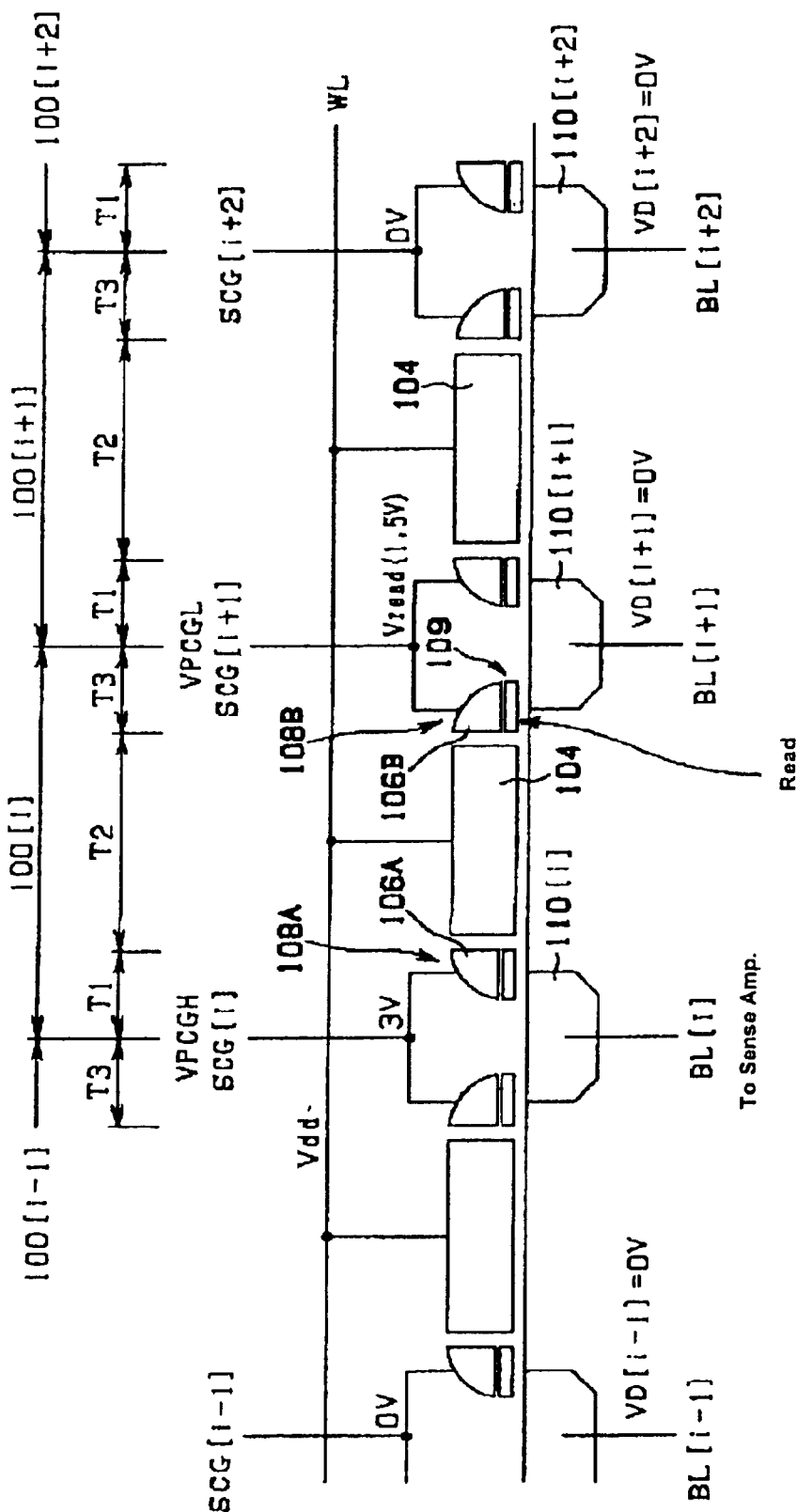
FIG. 10 is schematic for describing a data read operation in a non-volatile semiconductor memory apparatus.

First, operations in a data read mode when data is read from the memory cell are described with reference to the schematics of FIG. 10 and FIG. 11, the graph of FIG. 12, and the schematics of FIG. 13 and FIG. 14. In FIG. 10, a twin memory cell 100 [i] that is connected to one word line WL is defined as a selected cell, and the side of a MONOS memory element 108B adjacent to the word gate 104 of the selected cell is defined as a selected side. FIG. 10 shows potentials set at various locations when data is read out in a reverse mode from the selected memory element 108B. FIG. 10 indicates potentials set at various locations in the selected cell and in twin memory cells 100 [i−1] through 100 [i+2] that are non-selected cells adjacent to the selected cell. Also, FIG. 11 indicates set voltages in the selected cell. The opposite side of the selected memory element among the memory elements in the selected cell is defined as an opposing side, and the memory element on the opposing side is defined as an opposing memory element.

Figure 11:
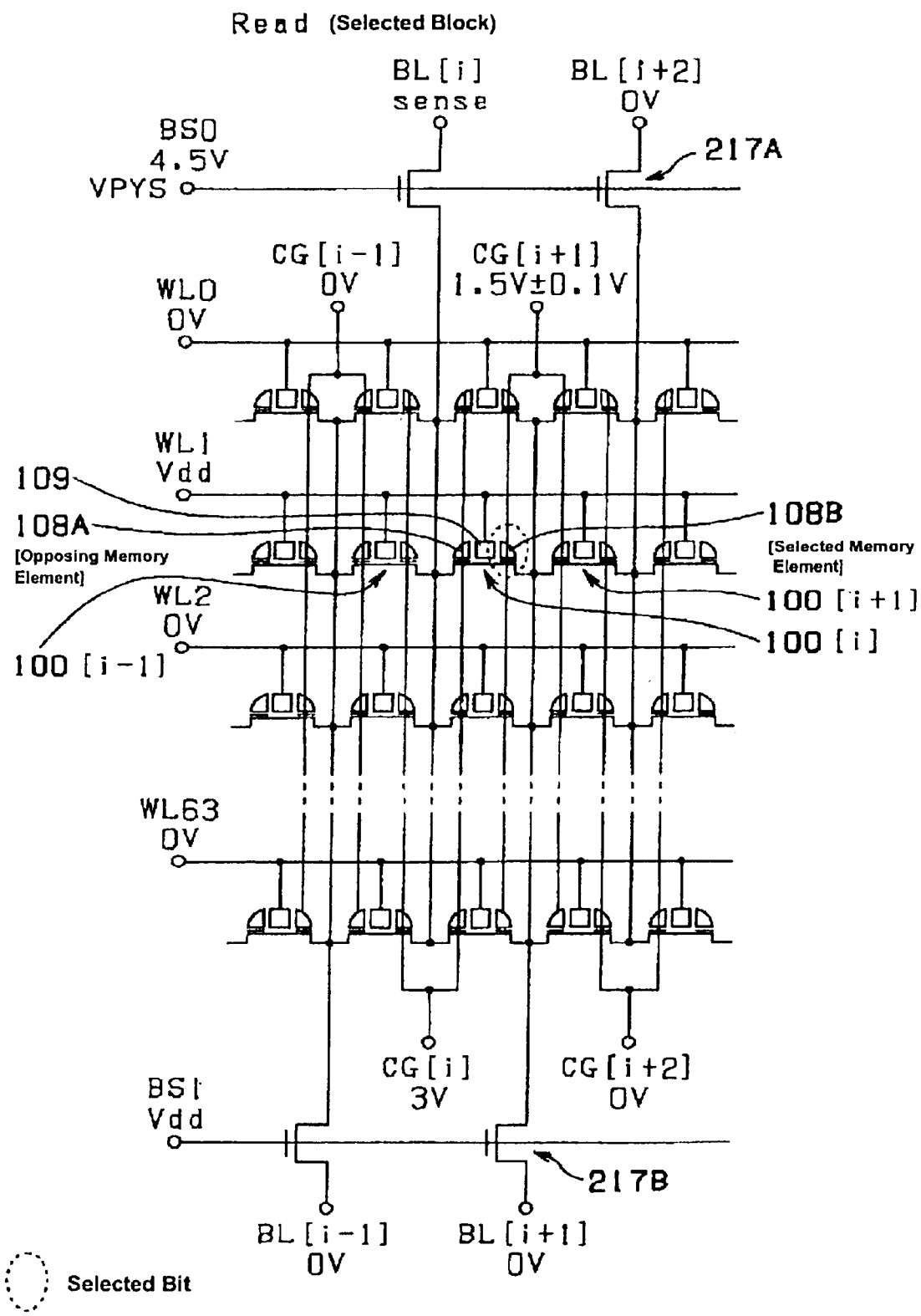
FIG. 11 is a schematic for describing voltages set within a selected block at the time of data reading.

As indicated in FIG. 11, in the twin memory cell 100 [i] in FIG. 10 that is a selected cell, it is assumed that the word gate 104 is connected to the word line WL1 in the second row in the memory block 214. In this case, Vdd (for example, 1.8V) is applied as a read word line selection voltage to the word line WL1. As a result, all of the transistors T2 in the twin memory cells in the second row are turned on. 0V is applied to the other word lines WL0, WL3, WL4, . . .

The constant voltage circuit 18 supplies 3V as a voltage VPCGH to the local control gate line drivers (CGDRV0

TABLE 2

| | Selected Block | | | | | | | | |
|---|---|---|---|---|---|---|---|---|---|
| | | | Selected Twin MONOS Cell | | | | | | |
| | | | Selected Memory element | | Opposing Memory element | | Non-selected Twin MONOS Cell | | |
| Mode | BS | WL | BL | CG | BL | CG | WL | BL | CG |
| Read | 4.5 V Opposing Side Vdd Selected Side | Vdd | 0 V | 1.5 V ± 0.1 V | Sense | 3 V | Vdd or 0 V | Sense or 0 V | 3 V or 1.5 V ± or 0.1 V or 0 V |
| Program | 8 V | About 1 V | 5 V | 5.5 V | 1 prg = 5 µA (0 to 1 V) | 2.5 V | About 1 V or 0 V | 5 V or Vdd or (0 to 1 V) | 5.5 V or 2.5 V or 0 V |
| Erase | 8 V | 0 V | 4.5 to 5 V | −1 to −3 V | 4.5 to 5 V | −1 to −3 V | | | | through CGDRV3) which then supply the same as an override voltage through the sub-control gate line SCG [i] to the control gate 106A on the opposing side of the twin memory cell 100 [i]. Also, the constant voltage circuit 16 supplies 1.5V as a voltage VPCGL to the local driver region 220A which then reads out the 1.5V and supplies the same as a voltage Vread to the control gate 106B on the selected side of the twin memory cell 100 [i] as a gate voltage VCG.

The override potential is a potential that is required to turn on a transistor corresponding to the opposing memory element and to flow programming current without regard to the presence or absence of programming of the opposing memory element in the twin memory cell 100 [i].

By the override voltage applied to the control gate 106A on the opposing side, the transistor T1 corresponding to the MONOS memory element 108A is turned on. In this case, the operation of the transistor T3 corresponding to the MONOS memory element 108B differs depending on whether or not charge is stored in the MONOS memory element 108B that is the selected cell.

Figure 12:
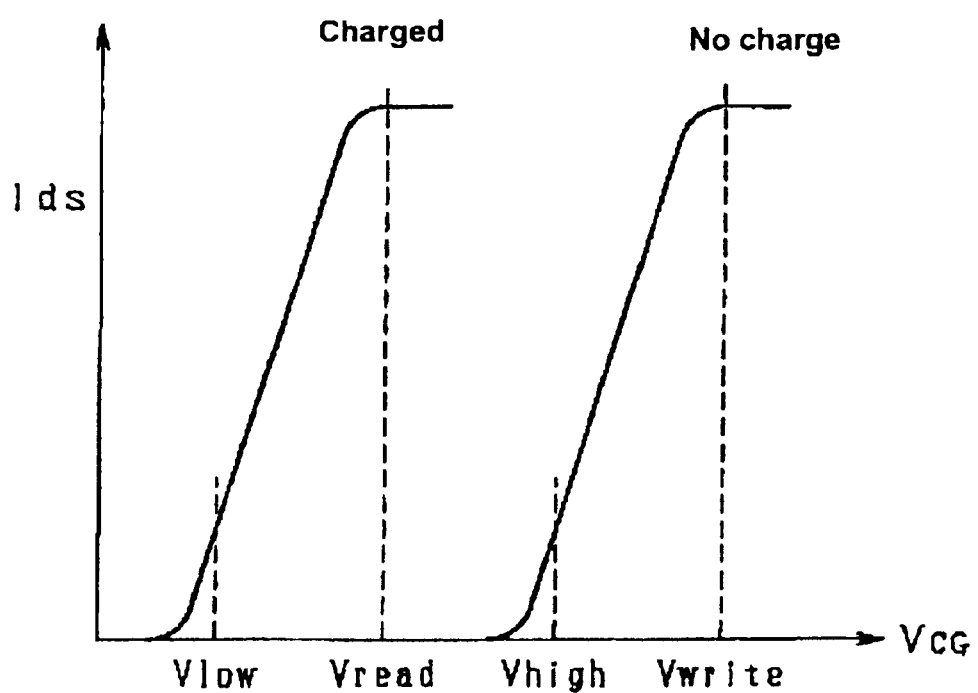
FIG. 12 is a graph that shows characteristic curves indicating the relation between control gate voltages VCG and source-drain currents Ids in a memory cell.

FIG. 12 shows the relationship between gate voltages VCG for the control gate on the selected side which are indicated along the horizontal axis and currents Ids that flow between the source and the drain of the transistor corresponding to the selected memory element which are indicated along the vertical axis.

As shown in FIG. 12, when no charge is stored in the MONOS memory element 108B that is the selected memory element, the current Ids starts flowing when the control gate voltage VCG exceeds a low threshold voltage Vlow. In contrast, when charge is stored in the MONOS memory element 108B that is the selected memory element, the current Ids does not start flowing unless the control gate voltage VCG on the selected side exceeds a high threshold voltage Vhigh.

A voltage Vread that is applied to the control gate 106B on the selected side at the data reading operation is set generally intermediate the two threshold voltages Vlow and Vhigh. Accordingly, when no charge is stored in the MONOS memory element 108B that is the selected memory element, the current Ids flows; and when charge is stored in the MONOS memory element 108B that is the selected memory element, the current Ids does not flow.

At the time of data reading operation, the bit line BL [i] (impurity layer 110 [i]) that is connected to the opposing memory element is connected to the sense amplifier 24, as indicated in FIG. 11. Also, potentials VD [i−1], [i+1] and [i+2] of the other bit lines BL [i−1], [i+1] and [i+2] are set at 0V, respectively. By dosing so, when no charge is stored in the MONOS memory element 108B that is the selected memory element, the current Ids flows, and a current of, for example, 25 μA or greater flows to the bit line BL [i] on the opposing side through the transistors T1 and T2 that are in an ON state. In contrast, when charge is stored in the MONOS memory element 108B that is the selected memory element, the current Ids does not flow, and a current that flows to the bit line BL [i] that is connected to the opposing memory element is, for example, less than 10 nA even when the transistors T1 and T2 are in an ON state.

In this manner, by detecting the current that flows in the bit line BL [i] of the opposing side, data can be read from the MONOS memory element 108B of the twin memory cell 100 [i], which is the selected memory element.

By the bit line selection transistor (n-type MOS transistor) 217A, the bit lines BL [i] and [i+2] become active; and by the bit line selection transistor 217B, the bit lines BL [i−1] and [i+1] become active.

It is difficult to provide the selection transistors 217A and 217B with a high current drivability due to the size limitation. In accordance with the present embodiment, they are provided with, for example, a channel width W=0.9 μm, and a channel length L=0.8 μm.

Since it is necessary to secure the aforementioned current on the bit line BL [i] that is connected to the sense amplifier 24, the gate voltage of the bit line selection transistor 217A is set at a high voltage, for example, 4.5V by the constant voltage circuit 14.

In the mean time, the voltage on the source side of the MONOS memory element 108A on the selected side in FIG. 11 reaches a voltage of about 0V (about several ten–several hundred mV). For this reason, the back gate of the bit line selection transistor 217B has few impact, and therefore its gate voltage is set at Vdd. As a voltage of 4.5V does not have to be supplied to the gate of the bit line selection transistor 217B, the load on the voltage generation circuit 55 (strong charge pump 11) can be reduced.

Non-selected cells within the selected block are set at voltage values indicated in Table 2 above.

Figure 13:
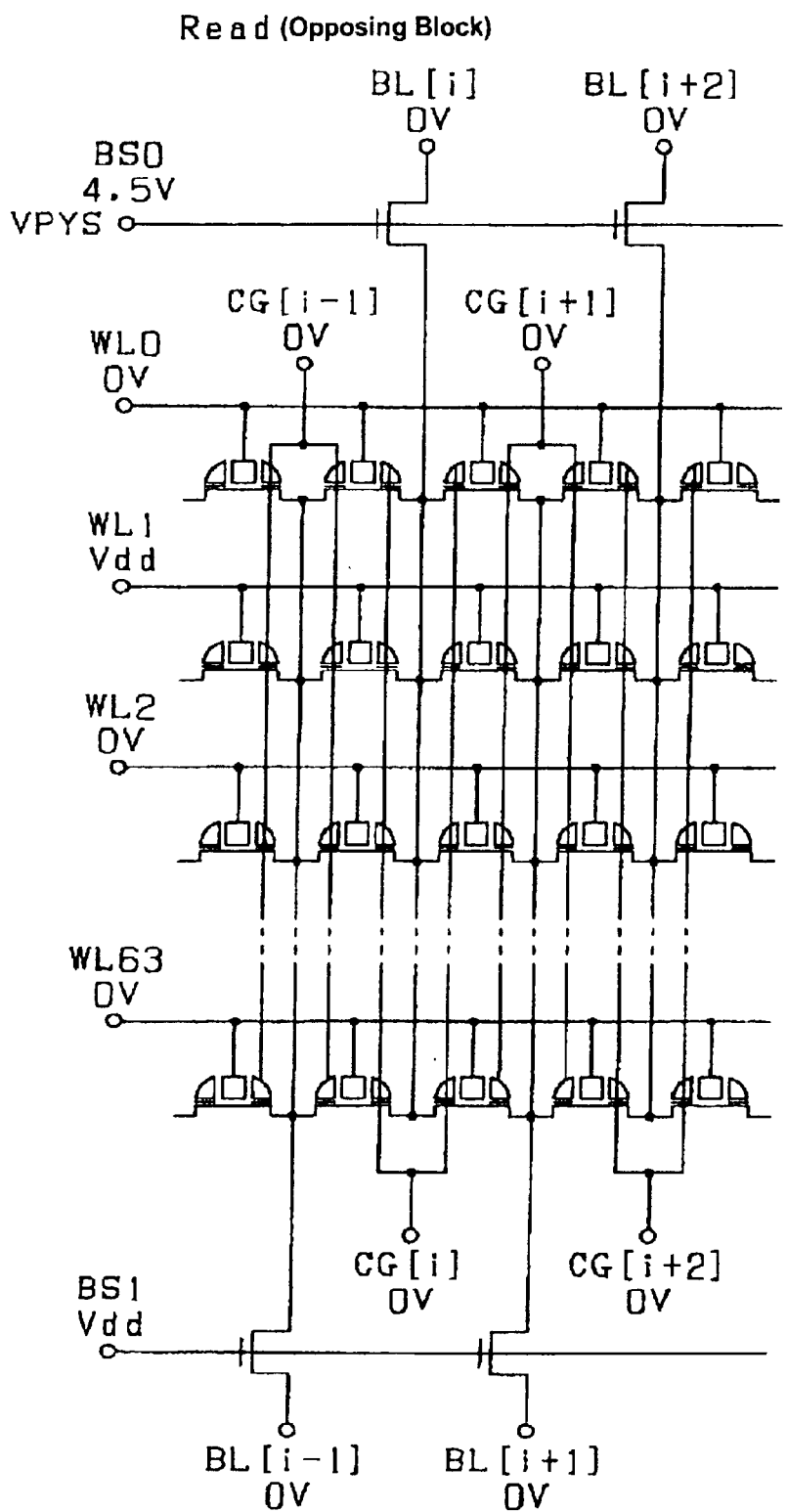
FIG. 13 is a schematic for describing voltages set within a non-selected opposing block at the time of data reading.

FIG. 13 describes voltages set in the opposing block in a data read mode when data is read from the memory cell.

In the opposing block in the first sector, voltages indicated in Table 3 above are set. In other words, as indicated in FIG. 13, since the voltage on each of the word lines WL and the gate voltage of the bit line selection transistors are shared in the $0^{th}$ and $1^{st}$ sectors, the same voltage values as those in the selected block indicated in FIG. 11 are set. All of the bit lines BL0–BL3 are set at 0V.

Figure 14:
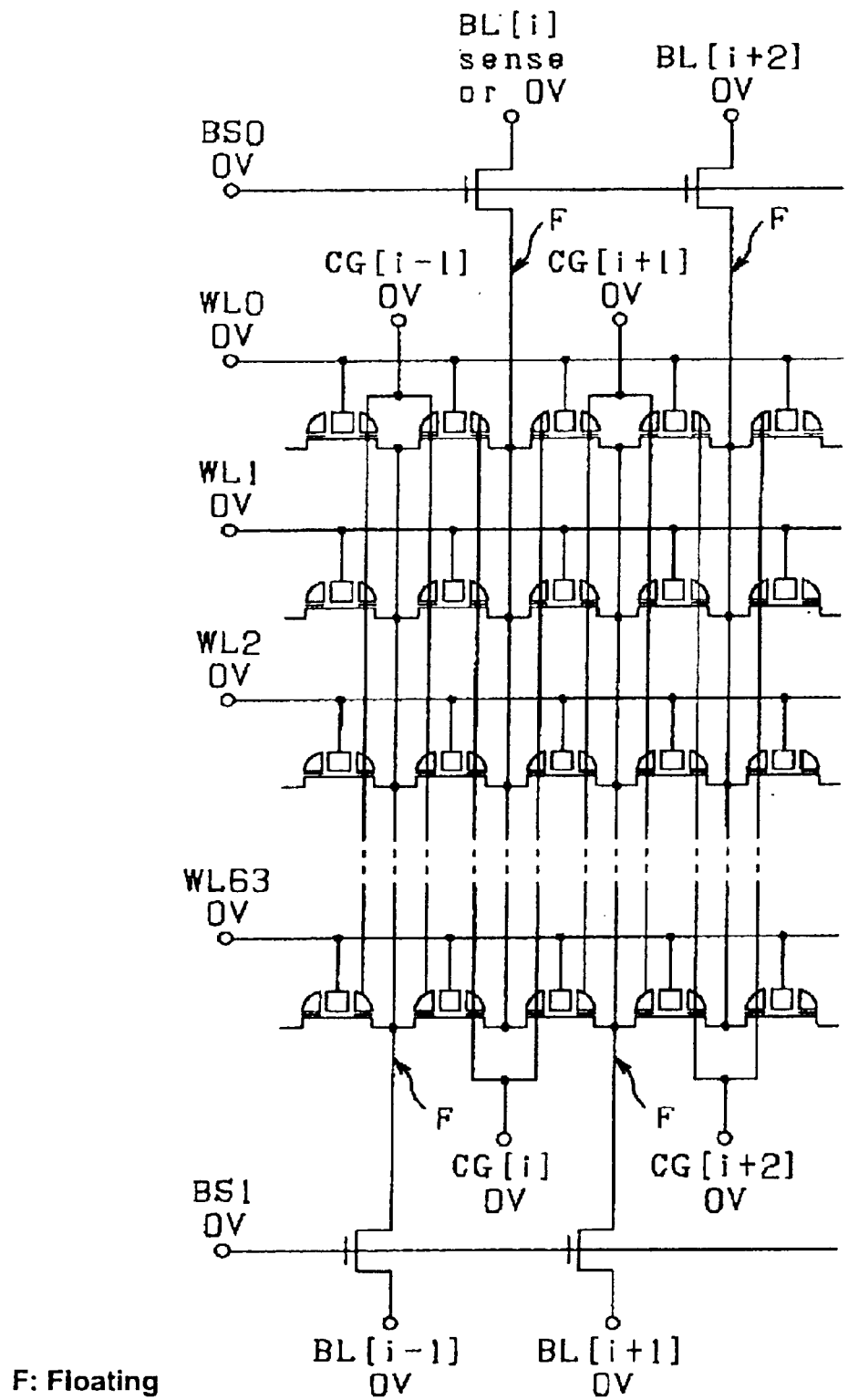
FIG. 14 is a schematic for describing voltages set within non-selected blocks other than the opposing block at the time of data reading.

FIG. 14 indicates a voltage setting state in non-selected blocks (small blocks 215) that exist in the $0^{th}$ through $63^{rd}$ sectors other than the selected block and opposing block. The voltage setting indicated in Table 3 above is also applied to each of the non-selected blocks shown in FIG. 13.

In these non-selected blocks, the gate voltage of the bit line selection transistors 217A and 217B, the word lines WL and the control gate lines CG are all set at 0V. As the bit line selection transistors 217A and 217B are off, the bit lines BL are placed in a floating state.

Next, operations that take place at the time of programming twin memory cells are described with reference to the schematics of FIGS. 15 through 20.

Figure 15:
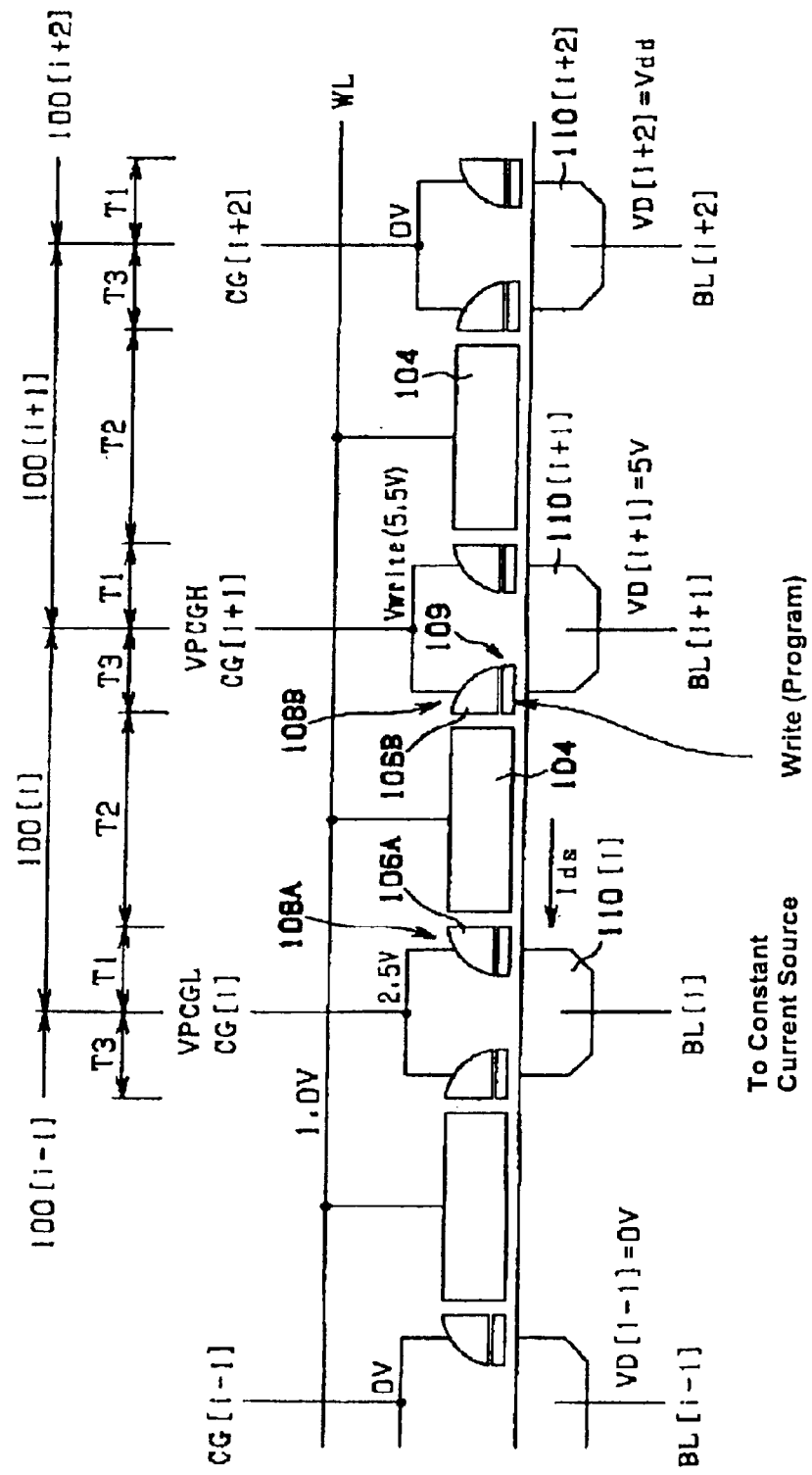
FIG. 15 is a schematic for describing a data write (program) operation in a non-volatile semiconductor memory apparatus.
Figure 16:
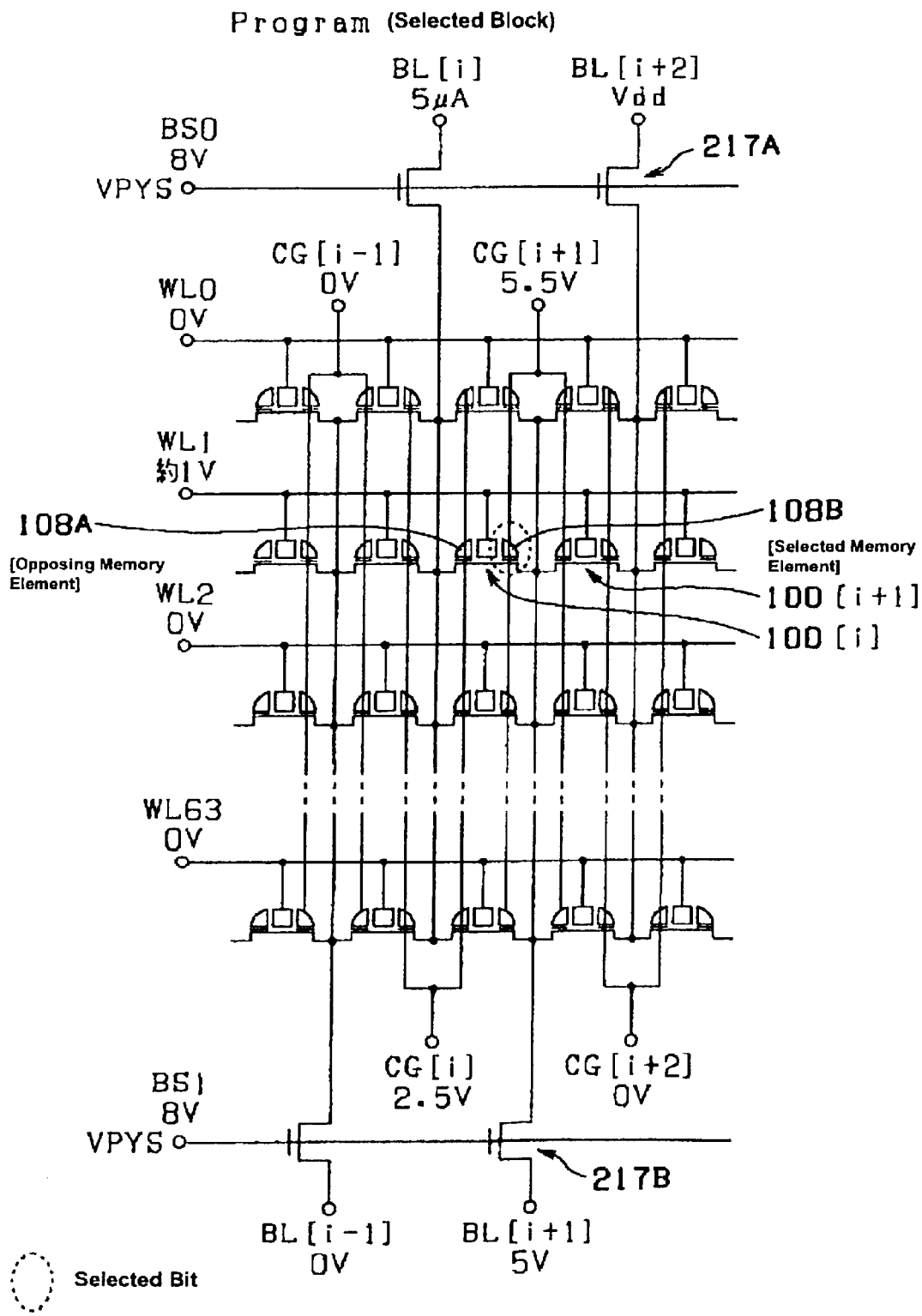
FIG. 16 is a schematic for describing voltages set within a selected block at the time of data programming.

In FIG. 15, a twin memory cell 100 [i] that is connected to one word line WL is defined as a selected cell, the side of a MONOS memory element 108B adjacent to the word gate 104 of the selected cell is defined as a selected side, and FIG. 15 shows potentials set at various locations when data programming is performed for the selected memory element 108B. FIG. 16 indicates potentials set at various locations in the selected block. A data erasing operation to be described below is performed before the data programming operation.

As indicated in FIG. 15, in a manner similar to FIG. 10, the potential on the sub-control gate line SCG [i] is set at an override potential (2.5V) by using an output of the constant voltage circuit 16, and the potential on the sub-control gate lines SCG [i−1] and [i+2] is set at 0V.

Also, the potential on each of the word gates 104 in FIG. 16 is set at a programming word line selection voltage of about 1.0V that is lower than the power supply voltage Vdd by the word line WL1 based on an output of the word gate voltage generation circuit 20. Also, a write voltage Vwrite (See Table 2 (5.5V)) that is a programming control gate voltage is applied to the control gate 106B of the selected memory element of the twin memory cell 100 [i] through the sub-control gate line SCG [i+1] by using an output of the constant voltage circuit 18.

To control BL selection in units of sectors, a Y pass circuit is provided for each sector for the bit lines BL that are I/O paths of the memory element as described above. With the Y pass circuit, input and output of the bit lines BL can be controlled in units of sectors.

Figure 17:
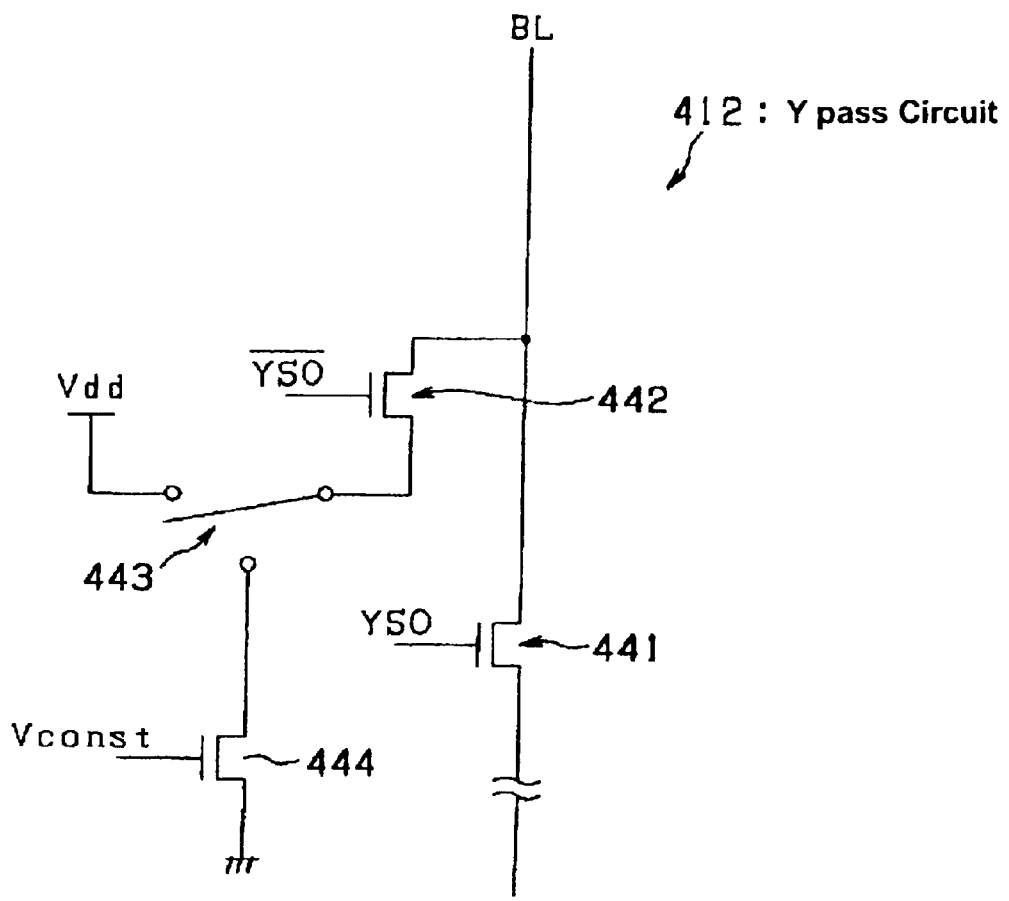
FIG. 17 is a schematic that shows a circuit diagram of a Y pass circuit that is connected to a bit line.

FIG. 17 schematically shows the interior of such a Y pass circuit 412 that is connected to the bit line BL. It is noted that the circuit shown in FIG. 17 corresponds to a transistor Q9 shown in FIG. 25 to be described below.

The Y pass circuit 412 includes therein a first transistor 441 that connects the bit line BL to the sense amplifier 24, and a second transistor 442 that connects it to another path. Signal YS0 and its inverted signal/YS0 are input in gates of the first and second transistors 441 and 442, respectively.

The source of the second transistor 442 connects to a constant current source 444 through a switch 443. The switch 443 flows 5 µA at the time of writing "0", and connects to Vdd at the time of writing "1".

At the time of programming, the first transistor 441 is turned on by the signal YS0, the bit line BL [i+1] is connected to the bit line driver through the transistor 441, and the voltage VD [i+1] of the bit line BL [i+1] is set at a programming bit line voltage that is, for example, 5V, as indicated in FIG. 15 and FIG. 16. The voltage of 5V is obtained from a voltage VPBL of 5.2V that is generated by the constant voltage circuit 13.

In the mean time, the second transistor 442 in the Y pass circuit 412, which is connected to the BL [i+2], is turned off by the signal/YS0, and the switch 443 selects the power supply voltage Vdd, such that the bit line BL [i+2] is set at the voltage Vdd.

By the Y pass circuit 412 that connects to the bit lines BL[i−1] and [i], a current from the constant current source 444 flows through the second transistor 442 and the switch 443 to the bit lines BL [i−1] and [i]. It is noted that the MONOS cell that connects to the bit line BL [i−1] is turned off as its control gate line CG [i−1] is at 0V. Accordingly, no current flows in the MONOS cell, and the bit line BL [i−1] is set at 0V through the constant current source 444.

With this setting, the transistors T1 and T2 of the twin memory cell 100 [i] are both turned on, and while the current Ids flows toward the bit line BL [i], channel hot electrons (CHE) are trapped in the ONO film 109 of the MONOS memory element 108B. In this manner, the programming operation is performed for the MONOS memory element 108B, and data "0" is written.

Here, there is also another method in which the programming word line selection voltage is set at about 0.77V instead of about 1V, and the bit line BL[i] is set at 0V. In the present embodiment, while the programming word line selection voltage is raised to about 1V to increase the source-drain current, the current that flows into the bit line BL [i] at programming is controlled by the constant current source 444. As a result, the voltage on the bit line BL [i] can be optimally set (in a range between 0V and 1V, and about 0.7V in the present embodiment), and therefore the programming operation can be optimally performed.

In the aforementioned operation, a voltage of 5.5V provided based on the output of the constant voltage circuit 18 is also applied to the control gate of the non-volatile memory element 108A on the left side of the twin memory cell 100 [i+1] that is a non-selected cell. In this case also, the voltage applied to the control gate CG [i+2] on the right side of the twin memory cell 100 [i+1] is 0V, and therefore no current flows between the source and the drain (between bit lines) of the twin memory cell 100 [i+1]. However, since a voltage of 5V is applied to the bit line BL[i+1], punch through current may flow and write disturb may occur if a high electric field is applied across the source and drain (bit lines) of the twin memory cell 100 [i+1].

Therefore, the voltage on the bit line BL [i+2] is set at Vdd, for example, instead of 0V, to thereby reduce a potential difference across the source and drain to prevent write disturb. Also, by setting the voltage on the bit line BL [i+2] at a voltage value exceeding 0V, and preferably a voltage value equivalent to or greater than a word line selection voltage at the time of programming, the transistor T2 of the memory cell [i+1] becomes difficult to turn on. Accordingly, this can also reduce or prevent disturbs.

Also, since a voltage of 5V needs to be supplied to the bit line BL [i+1], a voltage of 8V is applied to the gate of the bit line selection transistor 217B by a BL_select driver 21. In the mean time, a voltage of 8V is also applied to the gate of the bit line selection transistor 217A. Because of the need to set the bit line BL [i+2] at Vdd for the reasons described above, a voltage higher than Vdd also needs to be applied to the gate of the transistor 217A, and therefore the voltage of 8V that is the same as the gate voltage of the transistor 217B is used. The gate voltage of the bit line selection transistor 217A may be any level higher than Vdd+Vth.

The voltage setting indicated in Table 2 is applied to non-selected memory elements within the selected block.

Figure 18:
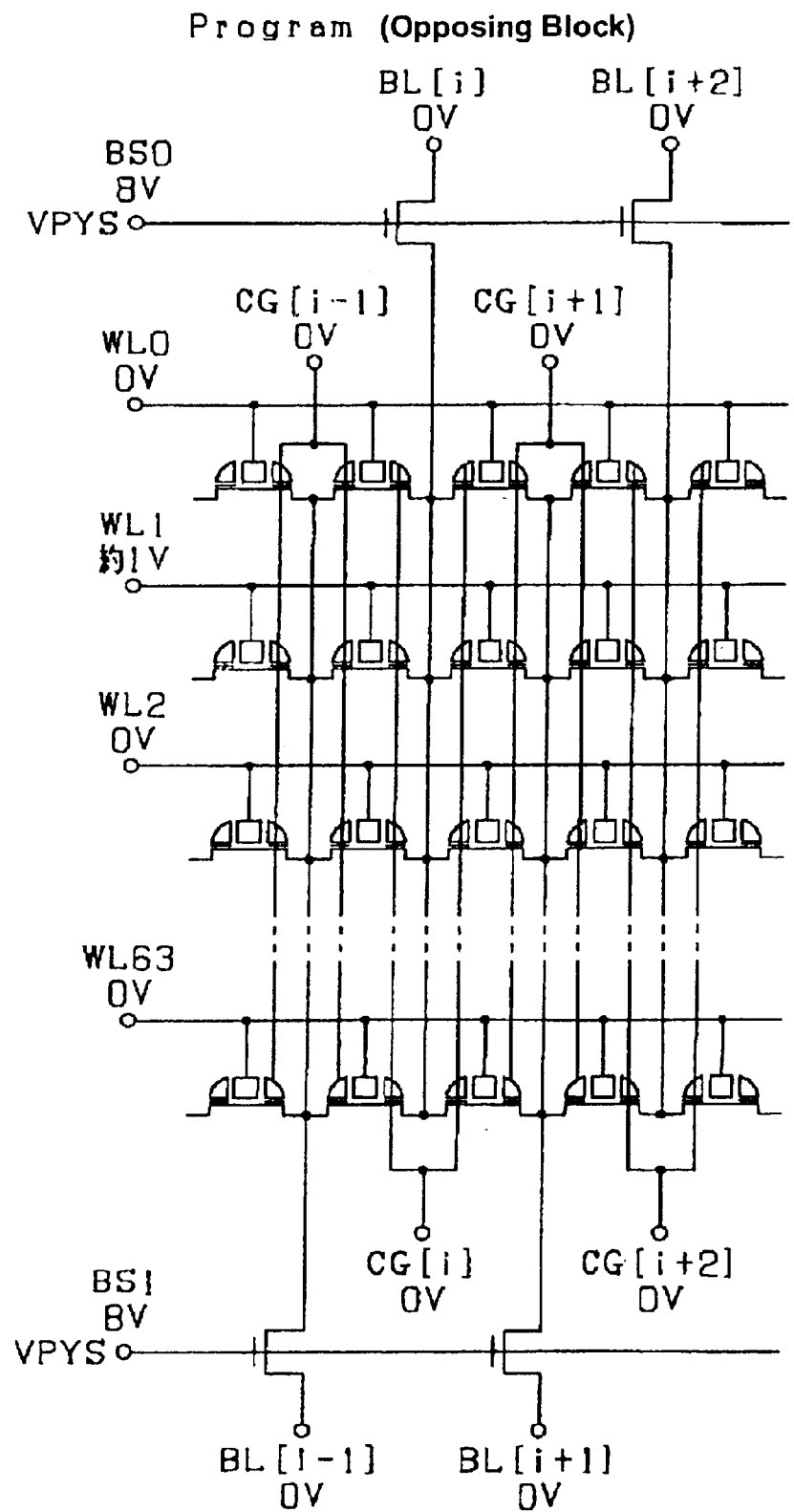
FIG. 18 is a schematic for describing voltages set within a non-selected opposing block at the time of data programming.

In the opposing block in the 1$^{st}$ sector, the voltage setting indicated in Table 3 above is applied. More specifically, as indicated in FIG. 18, since the voltage on each of the word lines WL and the gate voltage of the bit line selection transistors are shared in the 0$^{th}$ and 1$^{st}$ sectors, the same voltage values as those in the selected block indicated in FIG. 15 are set. All of the bit lines BL0–BL3 are set at 0V.

Figure 19:
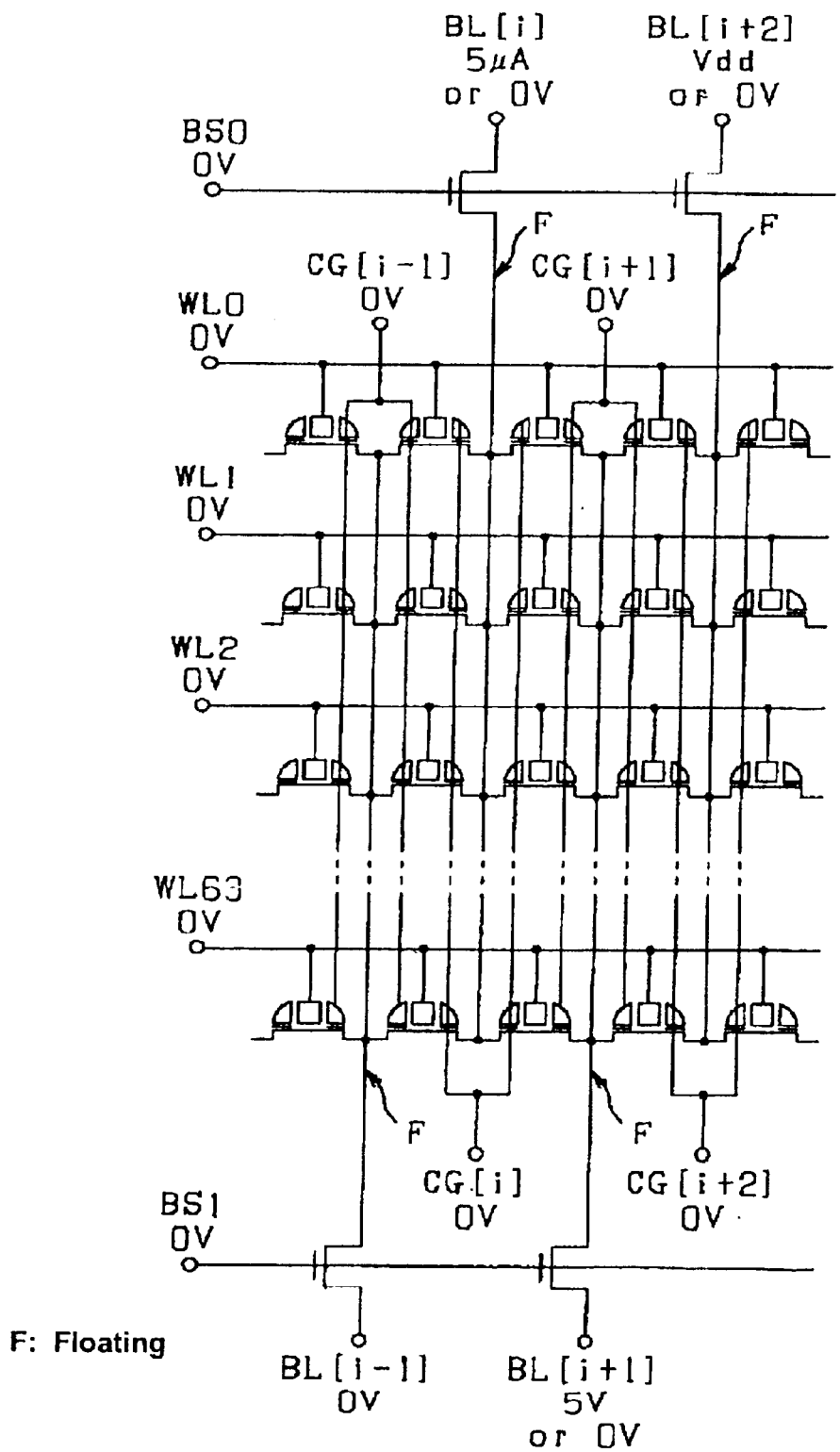
FIG. 19 is a schematic for describing voltages set within non-selected blocks other than the opposing block at the time of data programming.

FIG. 19 indicates a voltage setting state in non-selected blocks (small blocks 215) that exist in the 0$^{th}$ through 63$^{rd}$ sectors other than the selected block and opposing block. The voltage setting indicated in Table 3 above is also applied to each of the non-selected blocks shown in FIG. 19.

In these non-selected blocks, the gate voltage of the bit line selection transistors 217A and 217B, the word lines WL and the control gate lines CG are all set at 0V. As the bit line selection transistors 217A and 217B are off, the bit lines BL are placed in a floating state.

Figure 20:
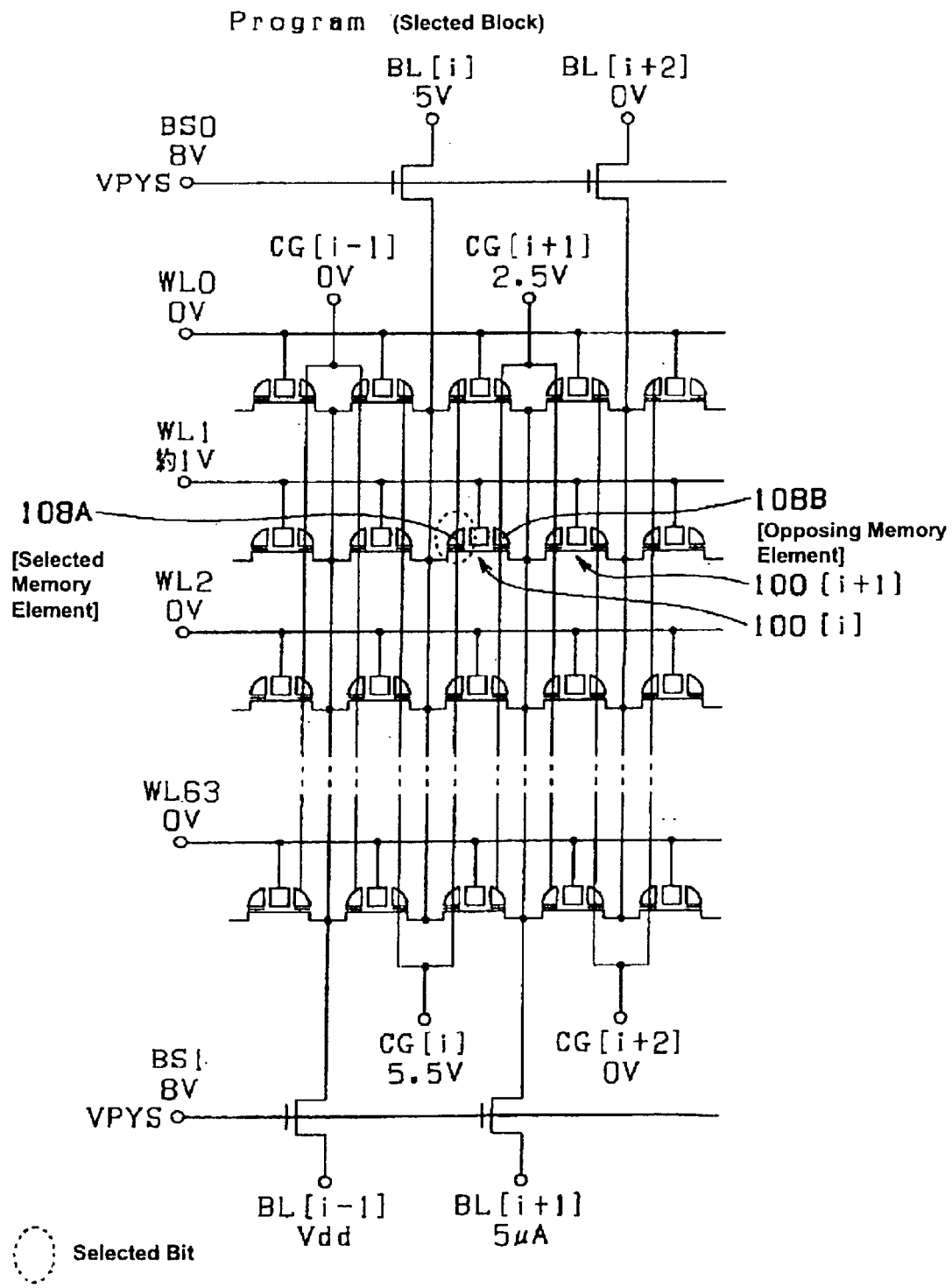
FIG. 20 is a schematic for describing voltages set within a selected block at the time of data programming for a memory element on the selected side, which is different from FIG. 16.

FIG. 20 indicates potentials set at various locations in the twin memory cells 100 [i−1], 100 [i] and 100 [i+1] when the MONOS memory element 108A on the left side of the twin memory cell 100 [i] is programmed.

Next, operations at the time of erasing data of twin memory cells are described with reference to the schematics of FIGS. 21 through 24.

Figure 21:
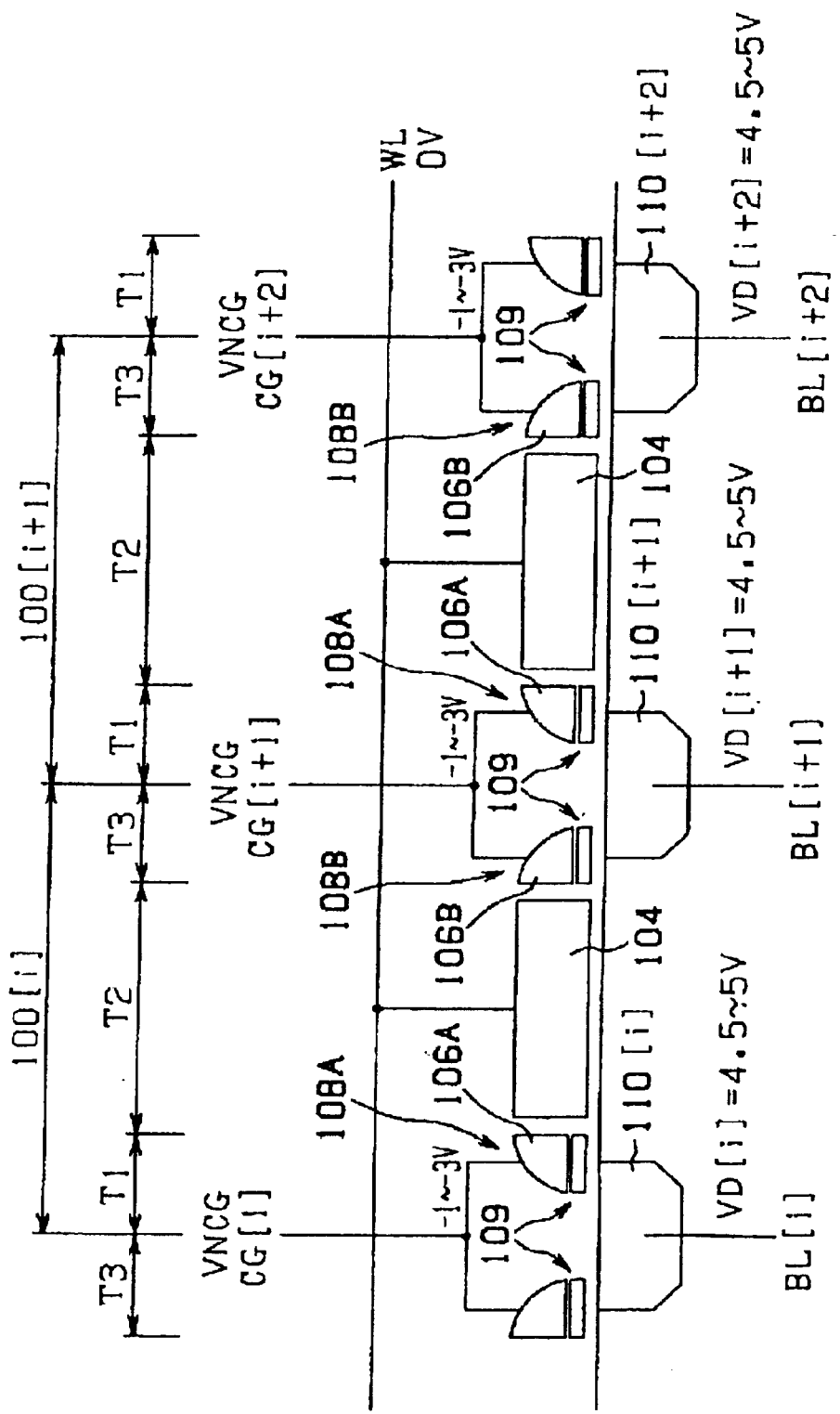
FIG. 21 is a schematic for describing a data erase operation in a non-volatile semiconductor memory apparatus.
Figure 22:
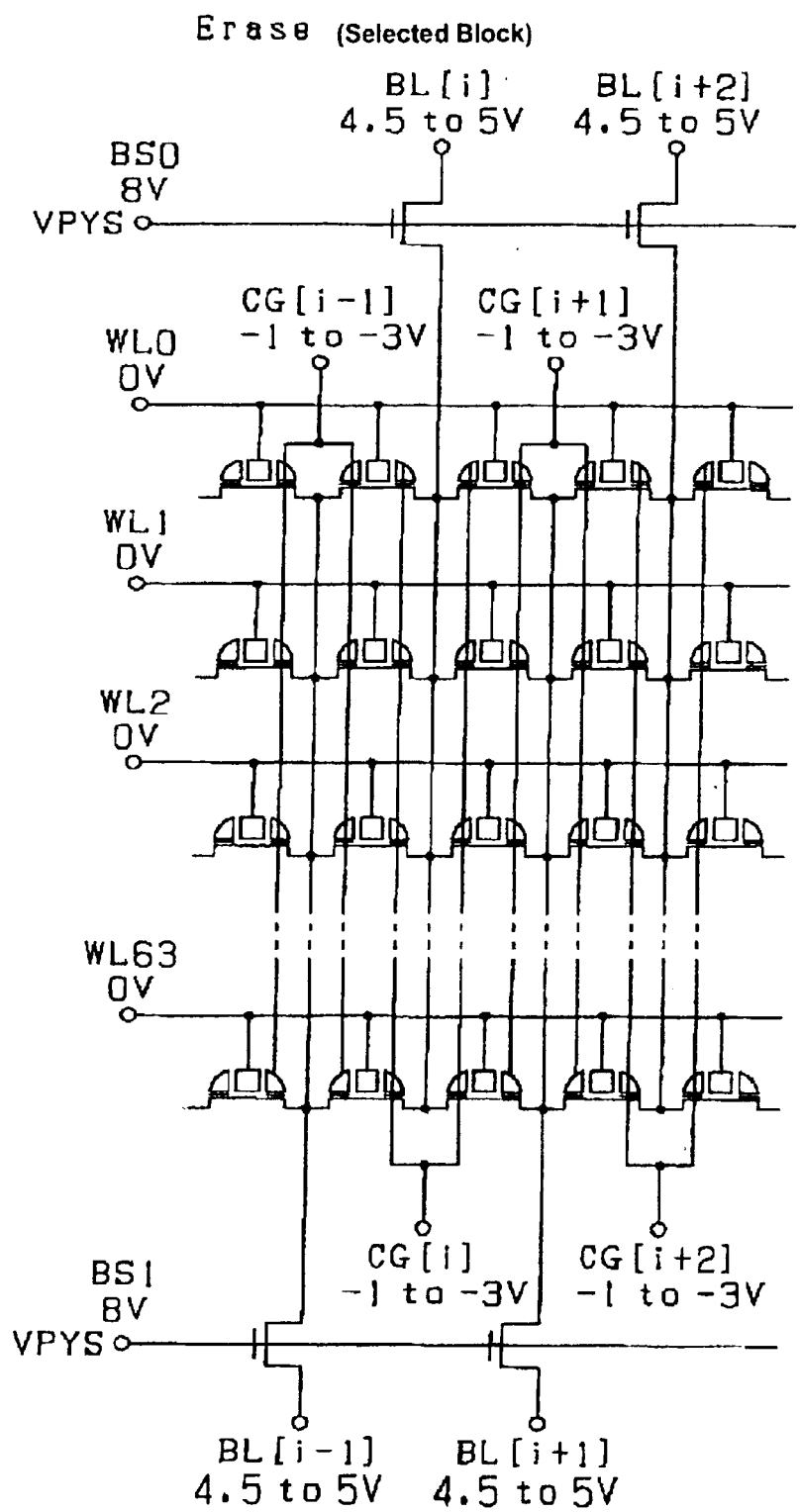
FIG. 22 is a schematic for describing voltages set within a selected block at the time of data erasing.

FIG. 21 indicates potentials set at various locations when data at all of the memory cells within the 0$^{th}$ sector are erased all together. FIG. 22 indicates voltages set at part of memory cells within the 0$^{th}$ sector.

As indicated in FIG. 21 and FIG. 22, at the time of data erasing, 0V is selected by the decoder, and the potential of each of the word gates 104 is set at 0V by the word line WL; and the potential of the control gates 106A and 106B is set at an erasing control gate line voltage of, for example, about −1V to −3V by the sub-control gate lines SCG [i−1], [i], [i+1] and [i+2], by using the output of a negative charge pump 26. Further, each of the potentials on the bit lines BL [i−1], [i], [i+1] and [i+2] is set at a erasing bit line voltage of, for example, about 4.5V to 5V by the bit line selection transistors 217A and 217B and the bit line drivers, by using the outputs of the constant voltage circuits 13 and 14.

In this case, the tunnel effect is generated by the erasing control gate line voltage applied to the control gates and the erasing bit line voltage applied to the bit lines, electrons that have been trapped in the ONO film 109 of each of the MONOS memory elements 108A and 108B are transferred and erased from the ONO films 109. In this manner, data in the memory elements of a plurality of twin memory cells simultaneously become "1" such that the data is erased.

As an erasing operation which may be different from the above, hot holes may be formed by band-band tunneling on the surface of the impurity layer which defines a bit, to thereby erase electrons that have been stored.

Also, without being limited to the operation of erasing data within one sector all together, data may be erased in a time sharing manner.

Figure 23:
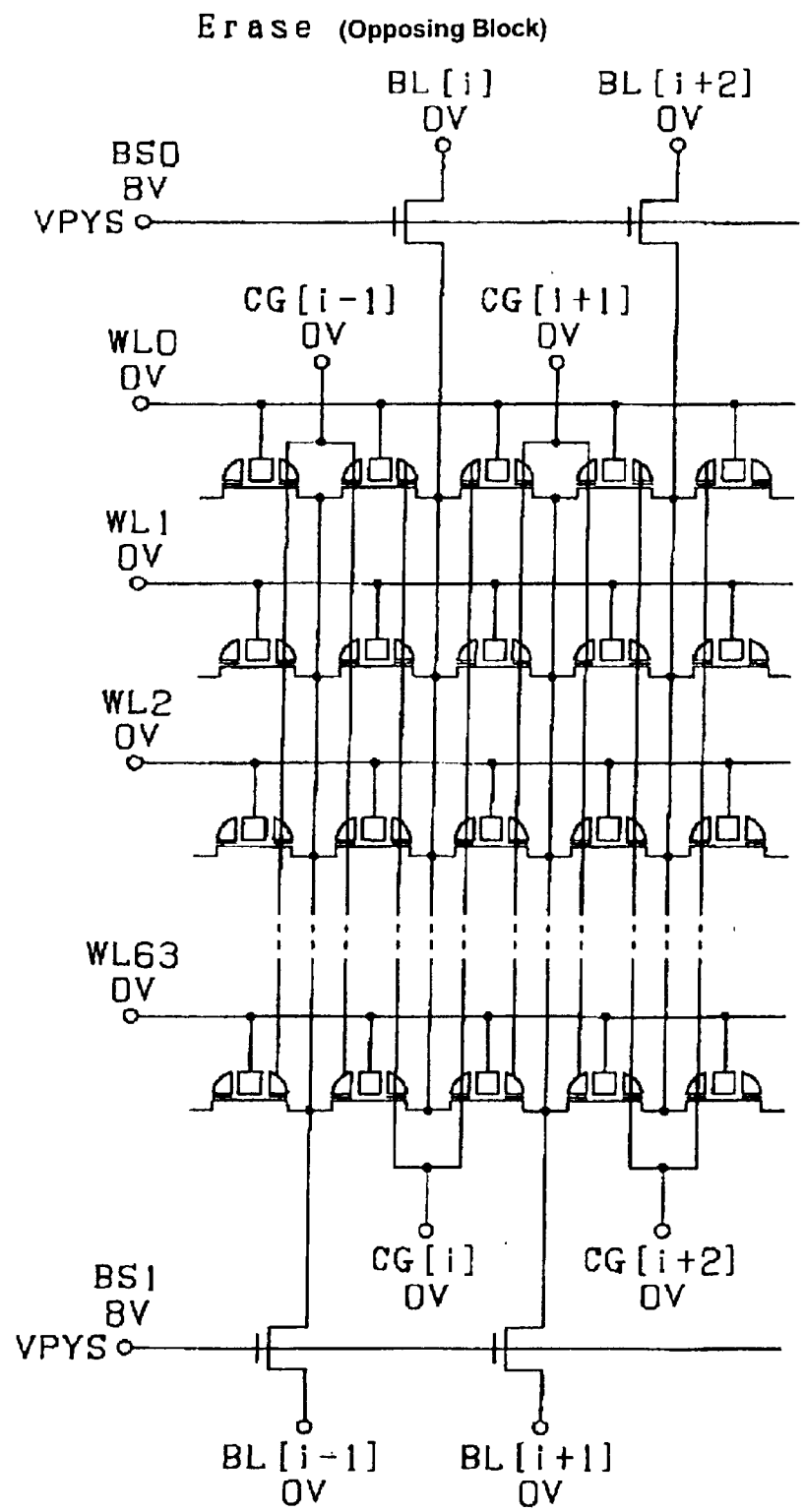
FIG. 23 is a schematic for describing voltages set within a non-selected opposing block at the time of data erasing.

In the opposing blocks within the $1^{st}$ sector, the voltage setting indicated in Table 3 is applied. More specifically, as indicated in FIG. 23, since the voltage on each of the word lines WL and the gate voltage of the bit line selection transistors are shared in the $0^{th}$ and $1^{st}$ sectors, the same voltage values as those in the selected block indicated in FIG. 19 are set. All of the bit lines BL0–BL3 are set at 0V.

Since the control gate line CG and the bit line BL are both at 0V, no disturb is generated in any of the cells within the opposing blocks.

Figure 24:
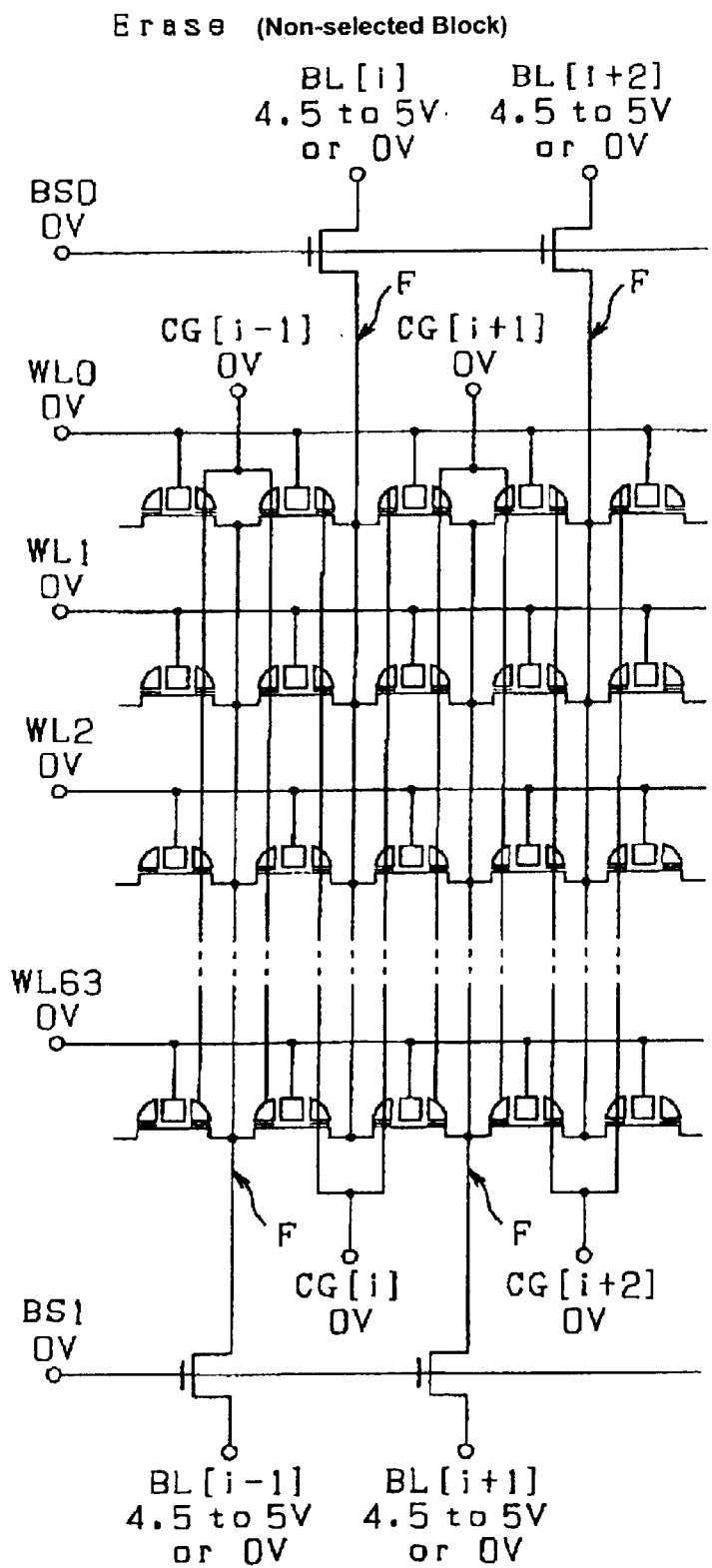
FIG. 24 is a schematic for describing voltages set within non-selected blocks other than the opposing block at the time of data erasing.

FIG. 24 indicates a voltage setting state in non-selected blocks (small blocks 215) that exist in the $0^{th}$ through $63^{rd}$ sectors other than the selected block and opposing block. The voltage setting indicated in Table 3 above is also applied to each of the non-selected blocks shown in FIG. 24.

In these non-selected blocks, the gate voltage of the bit line selection transistors 217A and 217B, the word lines WL and the control gate lines CG are all set at 0V. As the bit line selection transistors 217A and 217B are off, the bit lines BL are placed in a floating state.

However, the voltage on the bit lines BL is close to almost 0V, and no disturb is generated in any of the cells within the non-selected blocks.

Figure 25:
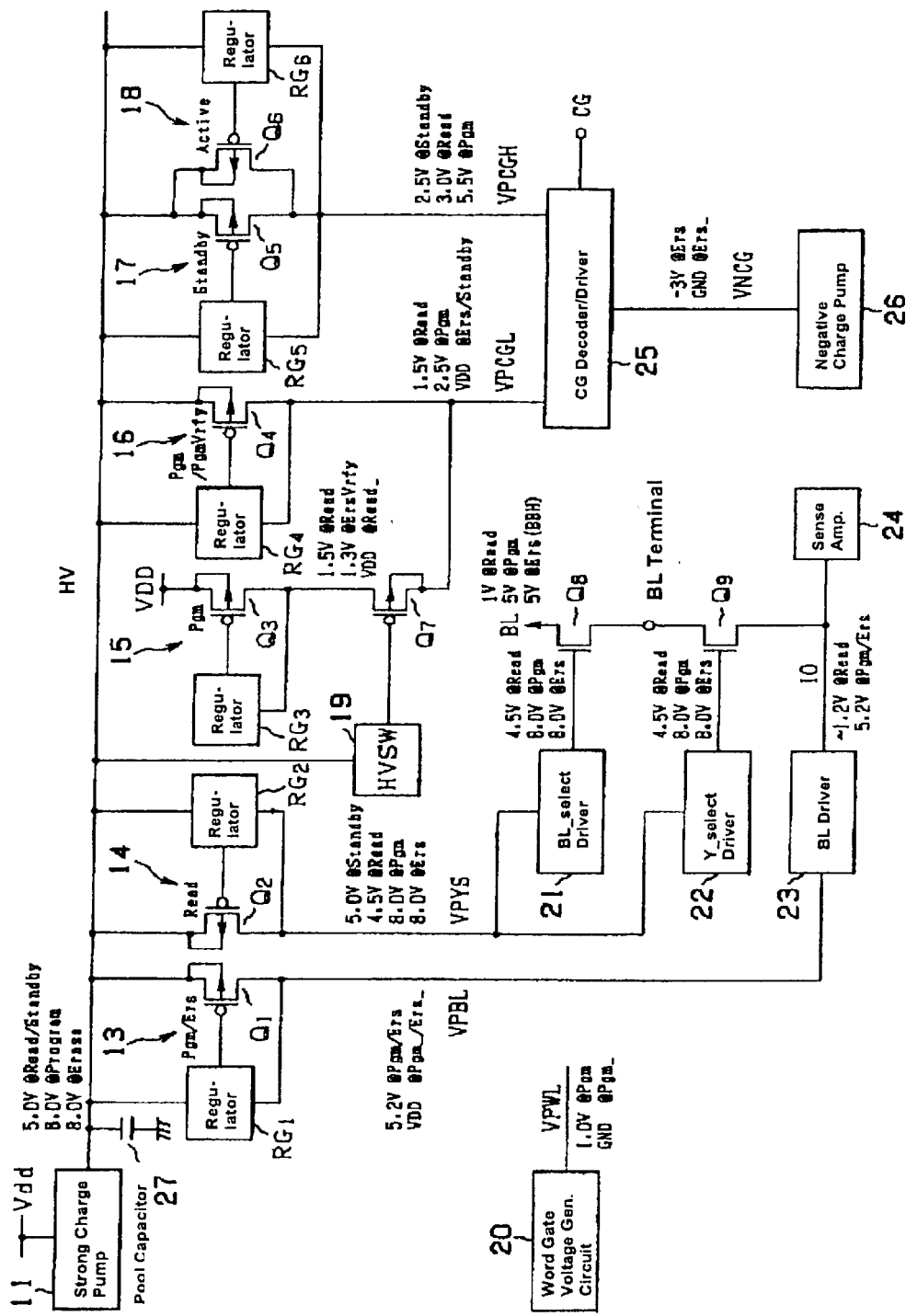
FIG. 25 is a schematic that shows a block diagram of a concrete structure of a voltage generation circuit shown in FIG. 1.

FIG. 25 is a schematic of a concrete structure of the voltage generation circuit 55 indicated in FIG. 1. In FIG. 25, for the simplification of the drawing, various drivers and signal lines are represented by single corresponding components, respectively, and connection relations are simplified to clarify the voltage generation sources and their supply destinations. In FIG. 25, . . . V@Standby, . . . V@Read, . . . V@Pgm, and V@Ers indicate voltages at the time of standby mode, read mode, program mode and erase mode, respectively.

In the present embodiment, by using one charge pump, a plurality of types of voltages required to provide memory reading, programming and erasing operations can be simultaneously generated.

Figure 26:
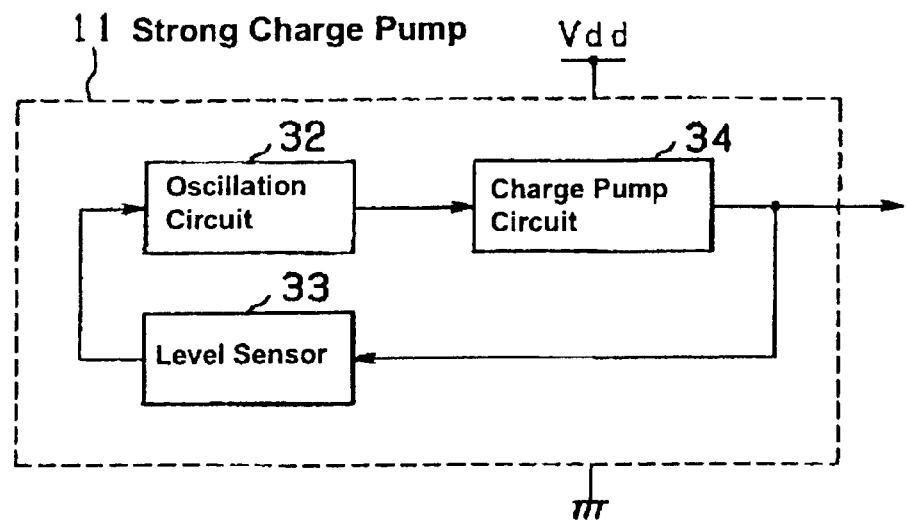
FIG. 26 is a schematic that shows a circuit diagram of a concrete structure of a charge pump 22 shown in FIG. 25.

Referring to FIG. 25, a strong charge pump 11 generates plural kinds of voltages from one power supply source Vdd. FIG. 26 is a schematic of a concrete structure of the strong charge pump 11 shown in FIG. 25.

The strong charge pump 11 is formed from an oscillation circuit 32, a charge pump circuit 34 and a level sensor 33. The oscillation circuit 32 outputs an oscillation output of a specified frequency to the charge pump circuit 34. The charge pump circuit 34 performs step-up processing with its charge pump operation for the oscillation output to thereby generate stepped-up voltages. The level sensor 33 detects levels of output voltages of the charge pump circuit 34 and controls the oscillation of the oscillation circuit 32 such that its level is at a specified value. By this, the strong charge pump 11 is capable of generating voltages at specified levels.

In accordance with the present embodiment, the strong charge pump 11 steps up the power supply voltage Vdd of 1.8V, for example, to generate 5.0V at reading operations, and 8.0V at programming and erasing operations depending on the operational conditions of the memory cell array.

A pool capacitor 27 is provided between an output terminal of the strong charge pump 11 and the reference voltage point. The pool capacitor 27 pools an output of the strong charge pump 11. In the present embodiment, the capacity of the pool capacitor 27 is set at a relatively small value.

Figure 27:
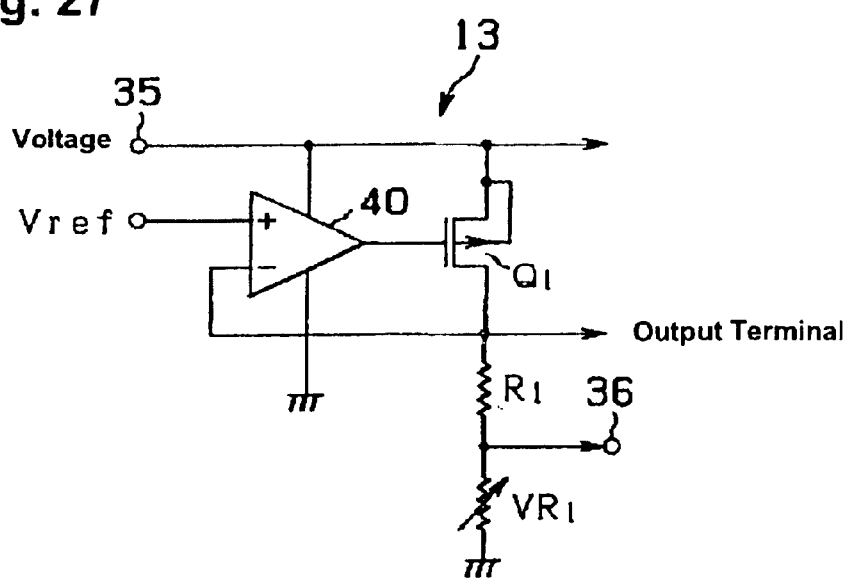
FIG. 27 is a schematic that shows a circuit diagram of a concrete structure of constant voltage circuits 13–18 shown in FIG. 25.

The output of the strong charge pump 11 (the retained voltage of the pool capacitor 27) is supplied to constant voltage circuits 13–18, which are formed from regulators RG1–RG6 and transistors Q1–Q6. FIG. 27 shows a circuit diagram of the constant voltage circuit 13 shown in FIG. 25. The structure of the other constant voltage circuits 14–18 is the same as that of the constant voltage circuit 13.

A voltage from the strong charge pump 11 is supplied to a terminal 35. A specified reference voltage Vref is applied to a positive polarity input terminal of a differential amplifier 40. An output terminal of the differential amplifier 40 connects to a gate of a p-type MOS transistor Q1. A source of the transistor Q1 connects to the terminal 35, and a drain thereof connects to a negative polarity input terminal of the differential amplifier 40. Also, the drain of the transistor Q1 connects to a reference potential point through a resistor R1 and a variable resistor VR1. The differential amplifier 40, the resistor R1 and the variable resistor VR1 form the regulator 13 shown in FIG. 25.

The transistor Q1 functions as a variable resistance element, and the differential amplifier 40 changes its output to make a difference between its two inputs to be "0". As a result, the voltage of the drain of the transistor Q1 coincides with the reference voltage Vref. Voltages appearing on an output terminal 36 have values in which the reference voltage Vref is resistance-divided with the resistance R1 and the variable resistance VR1. By appropriately setting resistance values of the variable resistance VR1, plural kinds of voltages can be generated as outputs of the constant voltage circuit 13.

As indicated in FIG. 25, in accordance with the present embodiment, the constant voltage circuit 13 can generate 5.2V or the power supply voltage Vdd as an output voltage VPBL. Also, the constant voltage circuit 14 can generate 5.0V, 4.5V or 8.0V as an output voltage VPYS. The voltage VPBL from the constant voltage circuit 13 is supplied to a BL driver 23, and the voltage VPYS from the constant voltage circuit 14 is supplied to a BL_select driver 21 and a Y_select driver 22.

As a voltage VPCGL to be described below, a voltage of the power supply voltage Vdd (1.8V) or lower may be used. Accordingly, the constant voltage circuit 15 steps down the power supply voltage Vdd to generate 1.5V, 1.3V or a voltage Vdd as the voltage VPCGL, and supplies the same to a CG decoder/driver 25. Also, a voltage PCGL is supplied to the CG decoder/driver 25 from the constant voltage circuit 16.

An output terminal of the constant voltage circuit 15 connects to a p-type MOS transistor Q7. A gate of the transistor Q7 connects to a HVSW (high voltage switch) 19. The power supply voltage is supplied from the strong charge pump 11 to the HVSW 19; and the application of a high level (hereafter referred to as "H") voltage to the transistor Q7 can turn off the transistor Q7. With this, when a voltage that is higher than the power supply voltage Vdd is supplied as the voltage VPCGL from the constant voltage circuit 16, the transistor Q7 can be turned off to prevent the current from flowing into the constant voltage circuit 15.

It is noted that the constant voltage circuit 16 can generate 1.5V, 2.5V, a voltage Vdd, 1.8V or 1.3V as an output voltage VPCGL.

Also, the constant voltage circuit 18 operates in an active mode, and can generates 3.0V or 5.5V as an output voltage VPCGH.

In the present embodiment, the constant voltage circuit 17 is provided in parallel with the constant voltage circuit 18. The constant voltage circuit 18 consumes currents on the order of several hundred $\mu$A, for example, when it supplies a generated voltage VPCGH. On the other hand, the constant voltage circuit 17 is set by appropriately setting values of the differential amplifier 40, resistance R1 and variable resistance VR1 (see FIG. 27) such that it consumes currents on the order of several $\mu$A, for example, when it supplies a generated voltage. The constant voltage circuit 17 operates in all the modes including the standby mode, and generates a voltage close to a voltage required at the time of reading as a voltage VPCGH (for example, 2.5V).

The BL driver 23 corresponds to a BL driver section in the sense amplifier and the BL driver shown in FIG. 1. The BL driver 23 uses a voltage VPBL supplied from the voltage generation circuit 50 to generate a voltage of 5.2V at the time of programming and erasing.

The BL_select driver 21 corresponds to a local bit line driver (BSDRV0, BSDRV1) in FIG. 6. The BL_select driver 21 receives a voltage VPYS, and applies to the gate of the transistor Q8 a voltage of 4.5V at the time of reading, 8.0V at the time of programming, and 8.0V at the time of erasing. The transistor Q8 corresponds to the bit line selection transistor 217A or 217B in FIG. 7. As described above, one small block is provided with each two (a total of four) bit line selection transistors 217A and 217B, that can activate each of the bit lines BL0–BL3.

The Y_select driver 22 and the transistor Q9 correspond respectively to the Y pass selection driver 410 and the Y pass circuit in FIG. 1. In other words, the Y_select driver 22 receives a supply of a voltage VPYS from the voltage generation circuit 55 through the Y decoder 404, and applies to the gate of the transistor Q9 a voltage of 4.5V at the time of reading, 8.0V at the time of programming, and 8.0V at the time of erasing.

The transistor Q9 forms a switch within the Y pass circuit 412 in FIG. 1. One of the source and drain of the transistor Q9 connects to the transistor Q8 through the BL terminal, and the other connects to the sense amplifier 24 and the BL driver 23. The BL driver 23 can apply a voltage of 5.2V to the bit lines BL through the transistors Q9 and Q8. In this manner, a voltage of 5V can be applied to each of the bit lines BL by the voltage generation circuit 55.

A negative charge pump 26 outputs as a voltage VNCG a voltage of –3V or a ground potential GND to the CG decoder/driver 25. The CG decoder/driver 25 corresponds to the local control gate line driver (CGDRV0–CGDRV3) in FIG. 6, and outputs of the CG decoder/driver 25 are supplied to four main control gate lines (MCG0–MCG3) of the small block row. Voltages VPCGL and VPCGH from the voltage generation circuit 55 are supplied to the local control gate line drivers (CGDRV0–CGDRV3) through control gate line drivers (CGdrv0–CGdrv7). The CG decoder/driver 25 is capable of supplying the inputted voltages VPCGL and VPCGH independently to each of the main control gate lines.

A word gate voltage generation circuit 20 generates as a voltage VPWL a voltage of 1.0V or a ground potential GND.

In this manner, in accordance with the present embodiment, the voltages provided by one strong charge pump 11 are used to generate plural types of voltages that are required for the respective operations of the memories.

Also, in accordance with the present embodiment, as described above, the strong charge pump 11 generates a voltage of 5.0V at the time of reading, and a voltage of 8.0V at the time of programming. The voltage to be applied to the transistor Q8 at the time of programming is 8.0V. In contrast, the operation voltage required for the main control gate lines MCG0–MCG3 at the time of reading is 4.5V.

In other words, in accordance with the present embodiment, the margin of output voltage of the strong charge pump 11 is made large at the time of reading. By this, at the time of reading, even when the voltage to be applied to each of the main control gate lines MCG0–MCG3 changes in short cycles, the output of the strong charge pump 11 can always be maintained at the required operation voltage of 4.5V or greater.

Also, since the output voltage of the strong charge pump 11 has a margin, the capacity of the pool capacitor 27 can be made relatively small. By this, the area occupied by the pool capacitor 27 can be reduced, and thus the overall size of the apparatus can be reduced.

Also, the constant voltage circuit 17 among the constant voltage circuits 17 and 18 that generate the voltage VPCGH operates even in the standby mode. The constant voltage circuit 17 generates a voltage of 2.5V, such that, even when the operation mode shifts from the standby mode to an active mode, such as the read mode, a memory element can be accessed immediately after such a mode shift, moreover, the current consumed by the constant voltage circuit 17 is extremely small, and therefore the current consumption at the time of standby mode can be substantially reduced.

For example, 1.8V is used as the power supply voltage Vdd for the entire apparatus of FIG. 1. This power supply voltage Vdd can always be supplied to each sections of the apparatus.

Next, operations of the embodiment thus structured are described.

The control logic 53 of FIG. 1 outputs predetermined control signals to the voltage generation circuit 55 according to control inputs. According to the control signals, the voltage generation circuit 55 controls the strong charge pump 11, and the constant voltage circuits 13–18.

(Operations at Read)

It can be assumed that the read mode is designated by the control logic 53. In this case, the strong charge pump 11 controls the level sensor 33 to generate a voltage of 5.0V. This voltage is supplied to the constant voltage circuits 13 through 18.

The constant voltage circuit 14 adjusts the variable resistance VR1 to generate a voltage VPYS of 4.5V at the time of reading. This voltage VPYS is supplied to the BL_select driver 21 and the Y_select driver 22. The voltage VPYS is supplied to the local bit line drivers (BSDRV0, BSDRV1) in FIG. 6.

The BL_select driver 21 (local bit line drivers (BSDRV0, BSDRV1)) selects a voltage of 4.5V and outputs the same to the transistor Q8 (bit line selection transistors 217A, 217B). As a result, the bit lines BL0–BL3 can be made active.

Also, the voltage generation circuit 55 provides the voltage VPYS to the Y_select driver 22, and the Y_select driver 22 selects a voltage of 4.5 and applies the same to the transistor Q9. By this, the transistor Q9 is turned on, and a specified one of the bit lines BL0–BL3 is conductively connected to the sense amplifier.

At the time of reading, the BL driver is not used. Also, the voltage VPBL from the constant voltage circuit 13 is not used. In this case, a bit line connected to the opposing memory element is connected to the sense amplifier, and a voltage of 0V is supplied to the other three bit lines among the bit lines BL0–BL3. By so doing, data can be read out by currents that flow on the bit lines to which the selected memory element and the opposing memory element are connected.

The constant voltage circuits 15 and 16 generate a voltage VPCGL of 1.5V, and supplies the same to the CG decoder/driver 25. In other words, the voltage generation circuit 55 supplies the generated voltage VPCGL to the local control gate line drivers (CGDRV0–CGDRV3). The CG decoder/driver 25 (local control gate line drivers (CGDRV0–CGDRV3)) provides the voltage VPCGH of 1.5V to the main control gate line MCG that is connected to the selected memory element.

The constant voltage circuits 17 and 18 output a voltage VPCGH of 3.0V to the CG decoder/driver 25. The CG decoder/driver 25 (local control gate line drivers (CGDRV0–CGDRV3)) provides the voltage VPCGH of 3.0V to the main control gate line MCG that is connected to the opposing memory element.

Potential changes on each of the main control gate lines MCG at the time of reading take place extremely fast. For this reason, a next reading may occur before the output voltage of the strong charge pump 11 recovers to the original voltage level. Even in this case, in accordance with the present embodiment, since the output voltage of the strong charge pump 11 is a voltage with sufficient margin (5.0V), which is greater than the voltage required at the time of reading (3.0V), the voltage that is provided by the constant voltage circuit 18 would not become lower than 3.0V.

(Operations at Programming)

Next, operations that take place when the program mode is set are described.

In this case, the strong charge pump 11 controls the level sensor 33 to generate the power supply voltage of 8.0V. The constant voltage circuit 14 generates a voltage VPYS of 8.0V and supplies the same to the BL_select driver 21. The BL_select driver 21 (local bit line drivers (BSDRV0, BSDRV1)) selects a voltage of 8V and outputs the same to the transistor Q8 (bit line selection transistors 217A, 217B). As a result, the bit lines BL0–BL3 become active.

Also, the constant voltage circuit 14 also outputs the voltage VPYS of 8.0V to the Y_select driver 22. The Y_select driver 22 selects a voltage of 8.0V and applies the same to the gate of the transistor Q9. As a result, the transistor Q9 is turned on, and a specified one of the bit lines among the bit lines BL0–BL3 can be made active.

The constant voltage circuit 13 generates a voltage VPBL of 5.2V and outputs the same to the BL driver 23. The BL driver 23 selects a voltage of 5.2V and supplies the same to each of the bit lines BL0–BL3. The constant voltage circuit 16 generates a voltage VPCGL of 2.5V and supplies the same to the CG decoder/driver 25. The CG decoder/driver 25 (local control gate line drivers (CGDRV0–CGDRV3)) provides the voltage VPCGL of 2.5V to the main control gate line MCG that is connected to the opposing memory element.

The constant voltage circuit 18 generates a voltage VPCGH of 5.5V from the power supply voltage of 8.0V and outputs the same to the CG decoder/driver 25. The CG decoder/driver 25 (local control gate line drivers (CGDRV0–CGDRV3)) provides the voltage VPCGH of 5.5V to the main control gate line MCG that is connected to the selected memory element.

(Operations at Erase)

Next, operations that take place when the erase mode is set are described.

In this case also, the strong charge pump 11 controls the level sensor 33 to generate the power supply voltage of 8.0V. The constant voltage circuit 14 generates a voltage VPYS of 8.0V and supplies the same to the BL_select driver 21. The BL_select driver 21 (local bit line drivers (BSDRV0, BSDRV1)) selects a voltage of 8V and outputs the same to the transistor Q8 (bit line selection transistors 217A, 217B). As a result, the bit lines BL0–BL3 become active.

Also, the constant voltage circuit 14 also outputs the voltage VPYS of 8.0V to the Y_select driver 22. The Y_select driver 22 selects a voltage of 8.0V and applies the same to the gate of the transistor Q9. As a result, the transistor Q9 is turned on, and a specified one of the bit lines among the bit lines BL0–BL3 can be made active.

The constant voltage circuit 13 generates a voltage VPBL of 5.2V and outputs the same to the BL driver 23. The BL driver 23 selects a voltage of 5.2V and supplies the same to each of the bit lines BL0–BL3.

The negative charge pump 26 generates a voltage VNCG of –3V and supplies the same to the CG decoder/driver 25. The CG decoder/driver 25 (local control gate line drivers (CGDRV0–CGDRV3)) provides the voltage VNCG of –3V to each of the main control gate lines MCG.

Similar operations are performed in other modes. Depending on the modes, the respective constant voltage circuits 13 through 18 create voltages VPBL, VPYS, VPCGL and VPCGH required for read, program and erase operations for each of the memory elements within the memory cell array region 200.

Also, in accordance with the present embodiment, in the standby mode, only the constant voltage circuit 17, one of the constant voltage circuits 17 and 18, operates. The constant voltage circuit 17 generates a voltage VPCGH of 2.5V, such that, even when the operation mode shifts from the standby mode to an active mode such as the read mode, a high speed access can be made immediately after such a mode shift. Also, the current consumed by the constant voltage circuit 17 in the standby mode is extremely small, and therefore the current consumption at the time of standby mode can be substantially reduced.

The word gate voltage generation circuit 20 generates a voltage VPWL that is supplied to each of the word lines WL0, WL1, . . . The voltage VPWL is supplied to the local word line drivers (WLDRV0–WLDRV63). As a result, the local word line drivers (WLDRV0–WLDRV63) apply predetermined voltages to the respective word lines WL0, WL1, . . .

In this manner, in accordance with the present embodiment, one charge pump circuit and a plurality of regulators are used to acquire a plurality of operating voltages required for each of the operation modes. As a result, the area occupied by the circuits can be reduced and the cost can be lowered, and the current consumption can be restricted.

Also, in accordance with the present embodiment, the margin of output voltage of the strong charge pump 11 is made large at the time of reading. By this, at the time of reading, even when the voltage to be applied to each of the main control gate lines MCG0–MCG3 changes in short cycles, the output of the strong charge pump 11 can always be maintained at the required operation voltage or greater. Also, since the output voltage of the strong charge pump 11 has a margin, the capacity of the pool capacitor 27 can be made relatively small. By this, the area occupied by the pool capacitor 27 can be reduced, and thus the overall size of the apparatus can be reduced.

Also, in accordance with the present embodiment, at the time of standby mode, only the constant voltage circuit 17 with a low current consumption is operated, and the constant voltage circuit 18 for active modes is not operated. As a result, the current consumption in the standby mode can be substantially reduced.

The present invention is not limited to the embodiments described above, and many medications can be made and implemented within the scope of the subject matter of the present invention.

For example, the structure of the non-volatile memory element 108A, 108B is not limited to the MONOS structure. The present invention can be applied to a non-volatile semiconductor memory apparatus that uses twin memory cells of a variety of other types, which can trap charge at two locations independently from one another, by using one word gate 104, and the first and second control gates 106A and 106B.

Also, in the embodiment described above, the division number of sectors, the division number of large blocks and small blocks, and the number of memory cells in each small block are presented as examples, and various other modifications can be made. The division number of large blocks that is 8 was determined in view of the restrictions derived from the metal wiring pitches. If the metal wiring pitches can be narrowed, the division number can be further increased. For example, with 16 divided blocks, the load capacity (gate capacity) of each one of the control gate lines is further reduced, such that a higher speed driving becomes possible. However, with the 16 divided blocks, as the number of main control gate lines increases, the lines and spaces must be narrowed, or the area must be increased. Also, the number of control gate drivers increases, which results in a greater area.

[Effects Of The Invention]

With the present invention described above, the following effects can be achieved. As a regulator for standby with a low current consumption is used, the power consumption at the time of standby can be significantly reduced.

What is claimed is:

1. A non-volatile semiconductor memory apparatus, comprising:
   a charge pump device that steps up and outputs a power supply voltage;
   a memory array formed of a plurality of non-volatile memory elements;
   an operation voltage setting device that sets operation voltages to execute plural modes for a specified non-volatile memory element of the plurality of non-volatile memory elements;
   a constant voltage device for activation that is provided with voltages output from the charge pump device to generate the operation voltages in an active state; and
   a constant voltage device for standby that is provided with a voltage output from the charge pump device to generate a voltage based on the operation voltage with a lower current consumption than voltages generated by the constant voltage device for activation.

2. The non-volatile semiconductor memory apparatus according to claim 1, the operation voltage generated by the constant voltage device for standby being a voltage higher than the power supply voltage.

3. The non-volatile semiconductor memory apparatus according to claim 1, the constant voltage device for standby generating an operation voltage for a read mode for the non-volatile memory element.

4. The non-volatile semiconductor memory apparatus according to claim 1, the charge pump device stepping up the power supply voltage to generate a plurality of voltages.

5. The non-volatile semiconductor memory apparatus according to claim 1, the constant voltage device being capable of generating constant voltages of different voltage values depending on read, program or erase mode for the non-volatile memory element.

6. The non-volatile semiconductor memory apparatus according to claim 1, the non-volatile memory element being a memory element that forms a twin memory cell controlled by one word gate and first and second control gates.

7. The non-volatile semiconductor memory apparatus according to claim 6, the operation voltage setting device setting voltage values provided from the constant voltage devices independently for the first and second control gates, and an impurity layer to access trapped charge of the non-volatile memory element.

8. The non-volatile semiconductor memory apparatus according to claim 6, the operation voltage setting device including:
   a word line connected to a word gate of the twin memory cell in the same row;
   a control gate line that is commonly connected to the mutually adjacent first and second control gates in the same column of the twin memory cells arranged adjacent to each other in a row direction; and
   a bit line that is commonly connected to impurity layers to access trapped charge arranged in the same column of the mutually adjacent non-volatile memory elements of the twin memory cells arranged adjacent to each other in the row direction, voltage values provided from the constant voltage devices being set independently for the control gate line and the bit line.

9. The non-volatile semiconductor memory apparatus according to claim 1, the non-volatile memory element including an ONO film formed of an oxide film (O), a nitride film (N) and an oxide film (O) as a charge trap site.

10. A non-volatile semiconductor memory apparatus, comprising:
    a charge pump device that steps up and outputs a power supply voltage;
    a memory array formed of a plurality of twin memory cells that each have two non-volatile memory elements;
    an operation voltage setting device that sets an operation voltage to execute each of reading, programming and erasing operations for a specified non-volatile memory element of the plurality of twin memory cells that each have two non-volatile memory elements controlled by one word gate, and first and second control gates;
    a constant voltage device for activation that is provided with voltages output from the charge pump device to generate the operation voltages in an active mode; and
    a constant voltage device for standby that is provided with a voltage output from the charge pump device to generate in an active mode a voltage based on the operation voltage to be supplied to the first and second control gates in a read mode with a lower current consumption than voltages generated by the constant voltage device for activation.

* * * * *